United States Patent [19]
Mizutani et al.

[11] Patent Number: 5,878,066
[45] Date of Patent: Mar. 2, 1999

[54] OPTICAL SEMICONDUCTOR APPARATUS DRIVING METHOD THEREFOR LIGHT SOURCE APPARATUS AND OPTICAL COMMUNICATION SYSTEM USING THE SAME

[75] Inventors: Natsuhiko Mizutani, Yokohama; Hajime Sakata, Atsugi; Yukio Furukawa, Sagamihara, all of Japan

[73] Assignee: Canon Kabushiki Kaisha, Tokyo, Japan

[21] Appl. No.: 904,448

[22] Filed: Jul. 31, 1997

Related U.S. Application Data

[63] Continuation of Ser. No. 622,677, Mar. 26, 1996, abandoned.

[30] Foreign Application Priority Data

| Mar. 31, 1995 | [JP] | Japan | 7-100601 |
| Oct. 9, 1995 | [JP] | Japan | 7-288054 |
| Jan. 29, 1996 | [JP] | Japan | 8-034382 |

[51] Int. Cl.$^6$ .................................................. H01S 3/10
[52] U.S. Cl. .................... 372/27; 45/46; 45/50; 45/96
[58] Field of Search ................... 372/27, 45, 46, 372/50, 96

[56] References Cited

U.S. PATENT DOCUMENTS

| 4,918,701 | 4/1990 | Amann et al. | 372/50 |
| 5,117,469 | 5/1992 | Cheung et al. | 385/11 |
| 5,131,060 | 7/1992 | Sakata | 385/2 |
| 5,233,187 | 8/1993 | Sakata et al. | 250/227.24 |
| 5,586,131 | 12/1996 | Ono et al. | 372/27 |
| 5,590,145 | 12/1996 | Nitta | 372/27 |

FOREIGN PATENT DOCUMENTS

| 0361035 | 4/1990 | European Pat. Off. . |
| 0591863 | 4/1994 | European Pat. Off. . |
| 62-144426 | 8/1987 | Japan . |
| 2117190 | 5/1990 | Japan . |
| 2-159781 | 6/1990 | Japan | H01S 3/18 |

OTHER PUBLICATIONS

T. Matsuyama, et al., "TM Mode Suppression Property, etc., " IEEE Photonics Technology Letters, vol. 2, No. 9, 1 Sep. 1990, 612 and 613.

Patent Abstracts of Japan, vol. 11, No. 376, (E–563), Aug. 12, 1987 (62–144426).

"Stability of Phase–Shifted DFB Lasers Against Hole Burning", by Pascal Correc. IEEE Journal of Quantum Electronics; vol. 30, No. 11, Nov. 1994; pp. 2467–2476.

(List continued on next page.)

*Primary Examiner*—James W. Davie
*Attorney, Agent, or Firm*—Fitzpatrick, Cella, Harper & Scinto

[57] ABSTRACT

An optical semiconductor apparatus includes at least two semiconductor laser portions each having a light waveguide with an active layer and a distributed reflector, and a stimulating unit for independently stimulating the active layers of the light waveguides. The semiconductor laser portions are serially arranged in a light propagation direction. The light waveguides are constructed such that a difference between propagation constants for two different polarization modes in one of the waveguides is different from a difference between propagation constants for the two different polarization modes in the other of the waveguides. When one of injection of a modulation current signal into or application of a modulation voltage to the optical semiconductor apparatus, an oscillation state can be switched between a state in which Bragg wavelengths for one of the two different polarization modes coincide with each other between the light waveguides and a state in which Bragg wavelengths for the other of the two different polarization modes coincide with each other between the light waveguides.

49 Claims, 20 Drawing Sheets

OTHER PUBLICATIONS

"Analysis of Oscillation Characteristics of Separated–Electrode DFB Laser Diodes", by Kazuro Kikuchi, et al., IEEE Journal of Quantum Electronics; vol. 26, No. 10, Oct. 1990, pp. 1717–1727.

"Stability in Single Longitudinal Mode Operation in GaInAsP/InP Phase–Adjusted DFB Lasers", by Haruhisa Soda, et al., IEEE Journal of Quantum Electronics; vol. QE–23, No. 6, Jun. 1987, pp. 804–814.

"Multielectrode Distributed Feedback Laser for Pure Frequency Modulation and Chirping Suppressed Amplitude Modulation", by Yuzo Yoshikuni, et al., IEEE Journal of Quantum Electronics; vol. LT–5, No. 4, Apr. 1987, pp. 516–522.

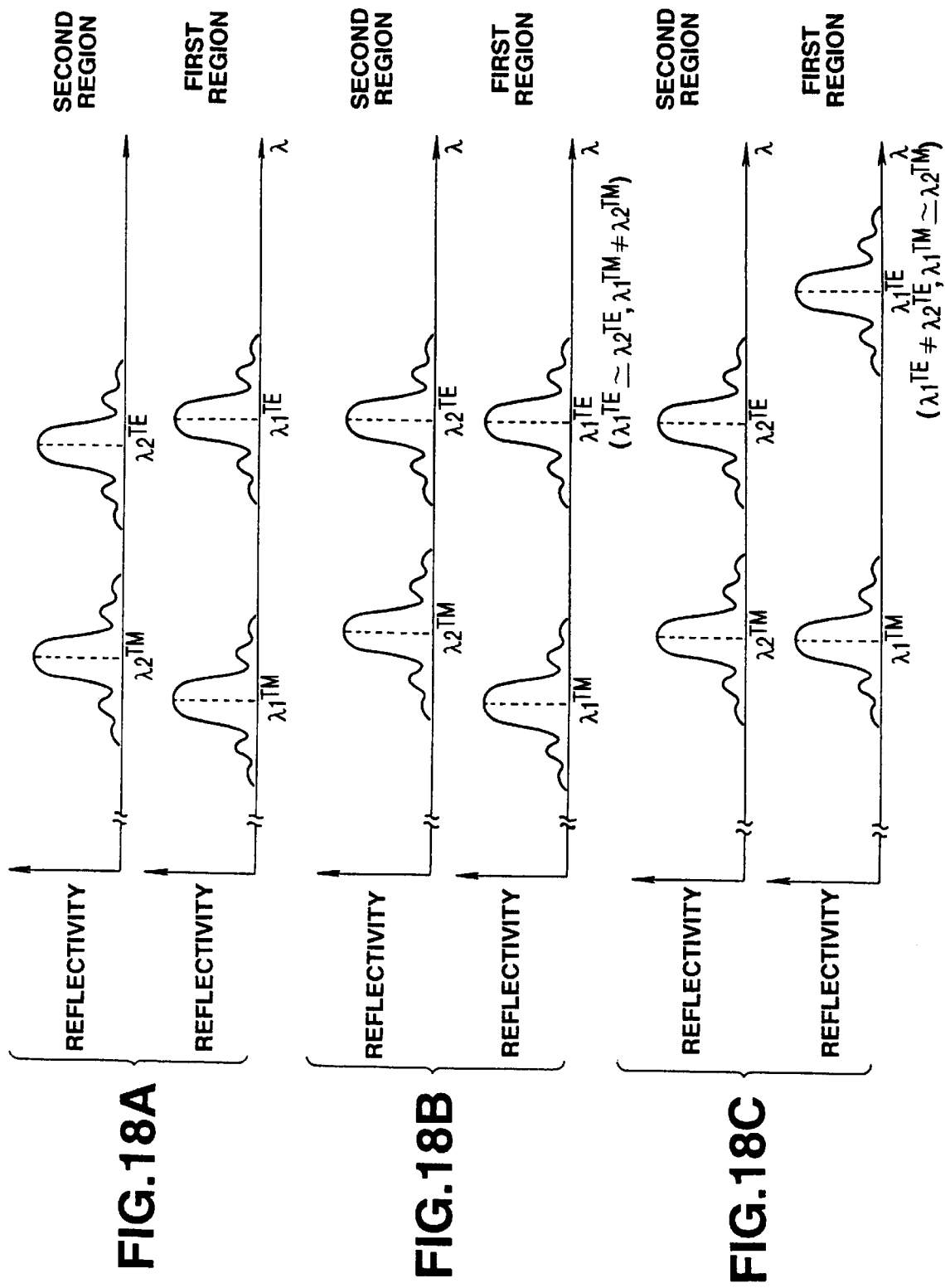

OPTICAL SEMICONDUCTOR APPARATUS DRIVING METHOD THEREFOR LIGHT SOURCE APPARATUS AND OPTICAL COMMUNICATION SYSTEM USING THE SAME

This application is a continuation of application Ser. No. 08/622,677 filed Mar. 26, 1996, now abandoned.

BACKGROUND OF THE INVENTION

1. Field of the Invention

The present invention relates to an optical semiconductor apparatus for use in optical communication systems and the like, for example, the optical semiconductor apparatus may be used in oscillation polarization mode selective semiconductor lasers which can be driven by a direct modulation method with reduced dynamic wavelength fluctuation even during high-speed modulation operation, and in polarization-insensitive optical amplifiers which can substantially equally amplify any polarized light component. The present invention also relates to a driving method for modulating or driving the optical semiconductor apparatus. The present invention also relates to a light source apparatus and to an optical communication system which use the optical semiconductor apparatus as a transmitter, for example.

More particularly, the present invention relates to an oscillation polarization mode selective semiconductor laser whose oscillation polarization mode can be switched between mutually-perpendicular polarization modes. The semiconductor laser of the present invention can suppress dynamic wavelength fluctuation even during high-speed modulation and stably achieve high-density frequency or wavelength division multiplexing (FDM or WDM) optical communication and the like.

2. Related Background Art

As an oscillation polarization mode selective dynamic single mode semiconductor laser, the following device has been developed and proposed. The oscillation polarization mode selective device has a structure that can be modulated by a digital signal which is produced by superposing a minute-amplitude digital signal on a bias injection current. The device is a distributed feedback (DFB) laser in which a distributed reflector of a grating is introduced into a semiconductor laser resonator or cavity and wavelength selectivity of the grating is utilized. In the device, strain is introduced into an active layer of a quantum well structure, or its Bragg wavelength is located at a position shorter than a peak wavelength of a gain spectrum, so that gains for transverse electric (TE) mode and transverse magnetic (TM) mode are approximately equal to each other for light at wavelengths close to an oscillation wavelength, under a current injection condition near an oscillation threshold. Further, a plurality of electrodes are arranged and currents are unevenly injected through those electrodes. An equivalent refractive index of the cavity is unevenly distributed by the uneven current injection, and oscillation occurs in one of the TE mode and the TM mode and at a wavelength which satisfies a phase matching condition and takes a minimum threshold gain. When the balance of the uneven current injection is slightly changed to vary a competitive relation of the phase condition between the TE mode and the TM mode, the oscillation polarization mode and wavelength of the device can be switched.

In that semiconductor device, an antireflection coating is provided on one end facet to asymmetrically employ effects of the uneven current injection into its output-side portion and its modulation-electrode portion. Alternatively, lengths of the electrodes are made different from each other to introduce a structural asymmetry.

Furthermore, Japanese Patent Laid-Open No. 2-117190 discloses a semiconductor laser apparatus in which two semiconductor devices are arranged serially or in parallel. One of devices principally oscillates or amplifies a wave in a predetermined polarization mode, and the other one chiefly oscillates or amplifies a wave in another polarization mode. Those devices are formed in a common layer or in parallel layers.

However, the above-discussed conventional oscillation polarization mode selective DFB semiconductor laser, which selects the oscillation polarization mode depending on the phase condition, is sensitive to the phase at the end facet. As a result, the oscillation wavelength and polarization mode of the device depend on the current injection condition in a complicated fashion, and fluctuation in characteristics of the oscillation polarization mode and the like appears among individual devices. If antireflection coatings were provided on both end facets to solve those disadvantages, asymmetry in a light propagation direction of the device would be weakened and the effect of the uneven current injection would be reduced. Thus, stable switching of the oscillation polarization mode would be lost.

In the apparatus of Japanese Patent Laid-Open No. 2-117190, the oscillation or amplification of the wave in a predetermined polarization mode is performed by selecting a device's geometric shape, as a result of which yield is decreased depending on fluctuation in etched depth and ridge width that occurs during a ridge fabrication process.

Furthermore, in a fabrication process of a semiconductor laser device, the device or crystal is generally degraded during a process in which the wafer is exposed to atmosphere. Moreover, during repetitive crystal growth steps, V-group element, whose vapor pressure is high, is likely to escape from the substrate surface when the substrate temperature is raised prior to a crystal growth step thereon, and hence the crystal is degraded.

SUMMARY OF THE INVENTION

An object of the present invention is to provide an optical semiconductor apparatus which can stably operate and is insensitive to an end-facet phase, such as a semiconductor laser apparatus which can select an oscillation polarization mode by dynamically changing effective reflectivities in its laser cavity.

Another object of the present invention is to provide an optical semiconductor apparatus which can stably operate and is suitable for wavelength tuning, such as a semiconductor laser apparatus which can select an oscillation polarization mode with little chirping by changing cavity losses for two different polarization modes.

Another object of the present invention is to provide an optical semiconductor apparatus which can stably operate with good reproducibility.

Still another object of the present invention is to provide a driving method thereof, an optical communication method and system and a light source apparatus using an optical semiconductor apparatus of the present invention.

The objects of the present invention are achieved by the following optical semiconductor and light source apparatuses, driving methods thereof, as well as the following optical communication methods and systems.

According to one aspect of the present invention for achieving the objects above, there is provided an optical semiconductor apparatus which includes at least two semiconductor laser portions each having a light waveguide with an active layer and a distributed reflector, and a stimulating unit, such as electrodes, for independently stimulating the active layers of the light waveguides. The semiconductor laser portions are serially arranged in a light propagation direction, and the light waveguides are constructed such that a difference between propagation constants for two different polarization modes in one of the waveguides is different from a difference between propagation constants for the two different polarization modes in the other of the waveguides. It can be said that the propagation constants may be replaced by Bragg wavelengths or equivalent refractive indices. In the structure of the optical semiconductor apparatus, for example, when laser light in the TE mode or the TM mode and at an oscillation wavelength is highlighted and efficiency for converting forward-propagating wave to backward-propagating wave is considered equivalent to reflectivity, two states, in which reflectivity of the TE mode is larger than reflectivity of the TM mode and in which reflectivity of the TM mode is larger than reflectivity of the TE mode, can be selectively created.

According to another aspect of the present invention for achieving the objects above, there is provided an optical semiconductor apparatus which further includes a refractive index regulating layer formed parallel to the active layer and a control unit for injecting current into or applying a voltage to the refractive index regulating layer independently from the stimulation of the active layer. The two refractive index regulating layers may be different or the same. In the structure of the optical semiconductor apparatus, two states, in which reflectivity of the TE mode is larger than reflectivity of the TM mode and in which reflectivity of the TM mode is larger than reflectivity of the TE mode, can be selectively created by injecting current into, or applying a voltage to, at least one of the refractive index regulating layers independently from the stimulation of the active layer.

According to another aspect of the present invention for achieving the object, there is provided an optical semiconductor apparatus which further includes a phase shift portion with a waveguide interposed between the two semiconductor laser portions and an equivalent refractive index of the waveguide of the phase shift portion is the largest or smallest of equivalent refractive indices of the three waveguides. In this structure, since the phase shift portion having different equivalent refractive indices for the different polarization modes is disposed, the phase condition for the resonated polarization mode can be satisfied near the Bragg wavelength and the polarization mode switching with low threshold can be attained stably and dynamically. Thus, the phase shift portion compensates for the phase shift of light which might occur during the laser resonance time, for one of the different polarization modes. The function of the phase shift portion is equivalent to the function of a $\lambda/4$ shift section at which a phase jump of a grating is formed, for example. In the polarization mode in which the Bragg wavelengths are coincident with each other, distributed reflection occurs for light near the Bragg wavelength in the semiconductor laser portions on opposite ends, and the light receives a phase shift function of $(2n-1)\lambda/4$ (n is a positive integer) in the central phase shift portion. Hence, the laser oscillation condition is satisfied and threshold gain decreases for such light. In contrast, in the polarization mode in which the Bragg wavelengths diverge from each other in the semiconductor laser portions on opposite ends, reflection loss is large and threshold gain increases.

According to another aspect of the present invention for achieving the objects above, there is provided a driving method for driving an optical semiconductor apparatus to switch its oscillation mode between two mutually-perpendicular oscillation polarization modes. The method includes a step of preparing an optical semiconductor apparatus discussed above, and a step of injecting a modulation current signal, which can be generated by superposing a modulated current signal on a bias constant current, for example, into at least one of the active layers of the light waveguides by the stimulating unit to switch an oscillation state between a state in which Bragg wavelengths for one of the two different polarization modes coincide with each other between the light waveguides and a state in which Bragg wavelengths for the other of the two different polarization modes coincide with each other between the light waveguides.

According to another aspect of the present invention for achieving the objects above, there is provided another driving method for driving an optical semiconductor apparatus semiconductor apparatus to switch its oscillation mode between two mutually-perpendicular oscillation polarization modes. The method includes a step of preparing an optical semiconductor apparatus discussed above, and a step of performing one of injection of a modulation current signal into and application of a modulation voltage signal to at least one of the refractive index regulating layers by the control unit to switch an oscillation state between a state in which Bragg wavelengths for one of the two different polarization modes coincide with each other between the light waveguides and a state in which Bragg wavelengths for the other of the two different polarization modes coincide with each other between the light waveguides.

According to another aspect of the present invention for achieving the objects above, there is provided another driving method for driving an optical semiconductor apparatus to switch its oscillation mode between two mutually-perpendicular oscillation polarization modes. The method includes a step of preparing an optical semiconductor apparatus discussed above, and a step of injecting a modulation current signal into at least one of the three waveguides, including one in the phase shift portion, by the stimulating unit to switch an oscillation state between two states. In one state, Bragg wavelengths for one of the two different polarization modes coincide with each other between the light waveguides and a resonance phase condition is satisfied. In another state, Bragg wavelengths for the other of the two different polarization modes coincide with each other between the light waveguides and a resonance phase condition is satisfied.

According to still another aspect of the present invention for achieving the objects above, there is provided a optical communication method for transmitting a signal from a transmitter to a receiver through an optical transmission line. The method includes a step of modulating the polarization mode of light output from an optical semiconductor apparatus of the present invention between two mutually-perpendicular polarization modes by controlling injection of current into, or application of a voltage to, the optical semiconductor apparatus. The method also includes a step of selecting only the light output in one of the two mutually-perpendicular polarization modes to create an amplitude-modulated signal, and a step of transmitting the amplitude-modulated signal through the optical transmission line.

According to still another aspect of the present invention for achieving the objects above, there is provided an optical communication system for transmitting a signal from a transmitter to a receiver through an optical transmission line. The system includes an optical semiconductor apparatus discussed above, and a unit for selecting only the light output in one of the two mutually-perpendicular modes so as to create an amplitude-modulated signal.

According to still another aspect of the present invention for achieving the objects above, there is provided a light source apparatus which includes the above-described optical semiconductor apparatus, a polarization mode of light output which is modulated between two mutually-perpendicular polarization modes by controlling current injection into, or voltage application to, the optical semiconductor apparatus, and a unit for selecting only the light output in one of the two mutually-perpendicular modes, such as a polarizer.

These advantages and others will be more readily understood in connection with the following detailed description of the preferred embodiments in conjunction with the drawings.

BRIEF DESCRIPTION OF THE DRAWINGS

FIG. 18A is a graph illustrating a state of the thirteenth embodiment in which Bragg wavelengths for the TE mode and the TM mode in a first region are different from each other and Bragg wavelengths for the TE mode and the TM mode in a second region are different from each other.

FIG. 18B is a graph illustrating a state of the thirteenth embodiment in which Bragg wavelengths for the TM mode in first and second regions are different from each other and Bragg wavelengths for the TE mode in first and second regions are equal to each other.

FIG. 18C is a graph illustrating a state of the thirteenth embodiment in which Bragg wavelengths for the TE mode in first and second regions are different from each other and Bragg wavelengths for the TM mode in first and second regions are equal to each other.

DESCRIPTION OF THE PREFERRED EMBODIMENTS

First Embodiment

Figure 1A:
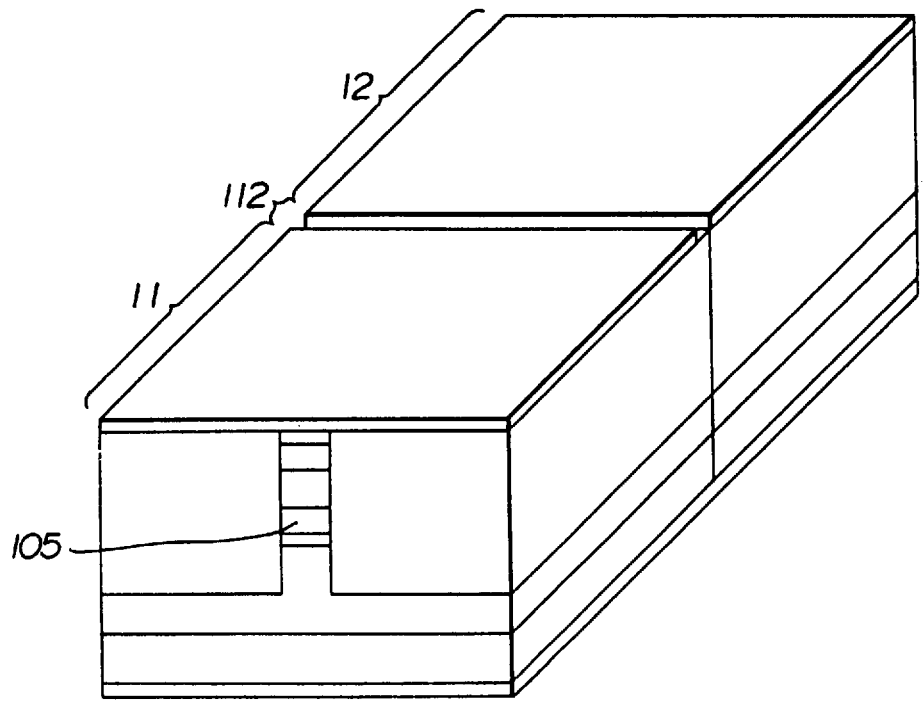
FIG. 1A is a perspective view illustrating a first embodiment of an optical semiconductor apparatus having waveguides with different widths according to the present invention.
Figure 1B:
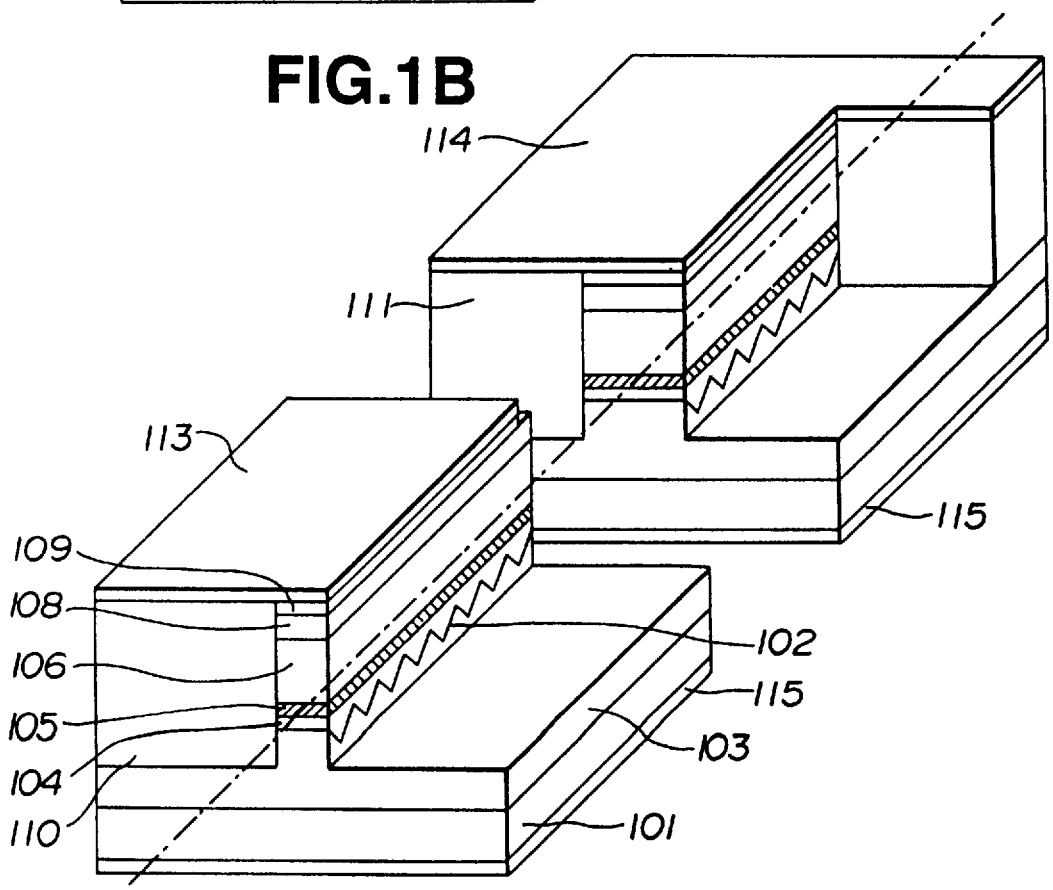
FIG. 1B is a perspective view illustrating a partly-cut structure of the first embodiment.

A first embodiment of the present invention, which is an InP/InGaAsP series semiconductor laser apparatus, will be described with reference to FIGS. 1A and 1B, FIGS. 2A–2C, and FIGS. 3A–3D. The device has the following structure. In FIG. 1A, reference numeral 11 designates a distributed feedback (DFB) portion on a light emission side, and reference numeral 12 designates a distributed feedback (DFB) portion on a modulation-electrode side.

On an n-type InP substrate 101, an InP lower clad layer 103 on which a diffraction grating 102 with a depth of 0.3 $\mu$m and a pitch of 235 nm is formed, an n-type $In_{0.73}Ga_{0.27}As_{0.59}P_{0.41}$ lower light guide layer 104 having a thickness of 0.15 $\mu$m, an active layer 105 of a strained quantum well structure, a p-type $In_{0.73}Ga_{0.27}As_{0.59}P_{0.41}$ upper light guide layer 106 having a thickness of 0.15 $\mu$m, a p-type InP clad layer 108, and a p-type $In_{0.59}Ga_{0.41}As_{0.9}P_{0.1}$ contact layer 109 are laid down in the named order. The active layer 105 having the strained quantum well structure consists of five pairs of intrinsic (i-) $In_{0.53}Ga_{0.47}As$ well layers (thickness: 6 nm) and i-$In_{0.28}Ga_{0.72}As$ barrier layers (thickness: 10 nm). A tensile strain is introduced into the barrier layers.

In the DFB portion 11 on the light emission side, a ridge is formed to set the width of the active layer 105 to 2 $\mu$m and the ridge is surrounded by high-resistance InP layers 110. In the DFB portion 12 on the modulation-electrode side, another ridge is formed to set the width of the active layer 105 to 5 $\mu$m and the ridge is also surrounded by high-resistance InP layers 111. An electrode-separation portion 112 is formed by removing the contact layer 109. Then, a Cr/AuZnNi/Au layer 113, which is an electrode of the DFB portion 11 on the light emission side, a Cr/AuZnNi/Au layer 114, which is an electrode of the DFB portion 12 for injecting a signal-superposed current therethrough, and an AuGeNi/Au layer 115, which is an electrode on the substrate side, are deposited, and those electrodes are alloyed. Films of $SiO_2$ are provided as an antireflection coating on both opposite end facets (not shown).

The operation of this embodiment will be described, comparing with a conventional example illustrated in FIGS. 2A–2C. FIG. 2B shows a state in which current is uniformly injected into the conventional device illustrated in FIG. 2A. Bragg wavelength $\lambda_b$ and propagation constant $\beta_0$ at $\lambda_b$ are related to a grating pitch $\Lambda$ as follows:

$\beta_0 = 2\pi n_{eql}/\lambda_b = \pi/\Lambda$ where $n_{eql}$ is the equivalent refractive index to which propagated light is sensitive. Propagation constants for the TE mode and the TM mode differ from each other depending on the shape of a buried waveguide, and accordingly, the Bragg wavelengths $\lambda_b^{TE}$ and $\lambda_b^{TM}$, at which the TE mode and the TM mode respectively are sensitive for the same grating, differ from each other. However, between a front portion 21 and a rear portion 22 illustrated in FIG. 2A (two electrodes and light waveguide portions thereunder are respectively called as such), differences between the Bragg wavelengths for each of the respective modes are almost equal to each other. Namely, $\lambda_{bf}^{TE} \approx \lambda_{br}^{TE}$
$\lambda_{bf}^{TM} \approx \lambda_{br}^{TM}$
$\lambda_{bf}^{TE} - \lambda_{br}^{TE} \approx \lambda_{bf}^{TM} - \lambda_{br}^{TM}$ where the Bragg wavelengths in the front portion 21 and the rear portion 22 are represented by $\lambda_{bf}$ and $\lambda_{br}$ and upper suffixes TE and TM indicate the polarization mode. The laser device oscillates at a wavelength whereat the phase condition is satisfied and the threshold gain is minimum near the Bragg wavelength for the TE mode or the TM mode.

Figure 2A:
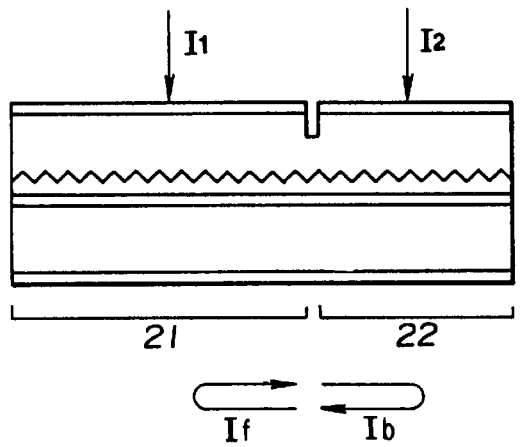
FIG. 2A is a cross-sectional view of a conventional laser device for illustrating oscillation polarization mode switching.
Figure 2B:
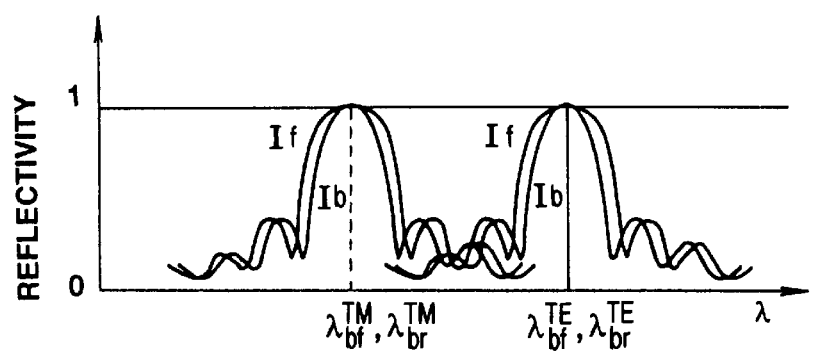
FIG. 2B is a graph illustrating a state in which Bragg wavelengths for the TM mode in front and rear portions are equal to each other and Bragg wavelengths for the TE mode in front and rear portions are equal to each other in the device of FIG. 2A.
Figure 2C:
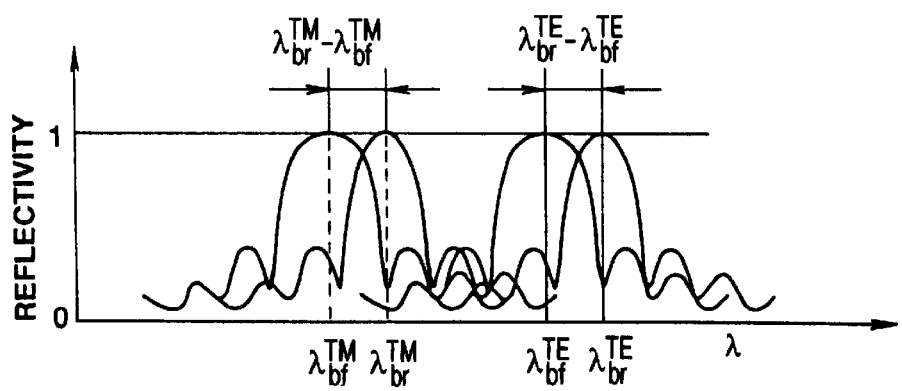
FIG. 2C is a graph illustrating a state in which Bragg wavelengths for the TM mode in front and rear portions are different from each other and Bragg wavelengths for the TE mode in front and rear portions are different from each other in the device of FIG. 2A.

FIG. 2C shows a state in which current is unevenly injected into the conventional device illustrated in FIG. 2A. Due to the uneven current injection, the Bragg wavelengths $\lambda_{bf}^{TE}$ and $\lambda_{br}^{TE}$ for the TE mode differ from each other between the front portion 21 and the rear portion 22, and the Bragg wavelengths $\lambda_{bf}^{TM}$ and $\lambda_{br}^{TM}$ for the TM mode also differ from each other between the front portion 21 and the rear portion 22. As illustrated in FIG. 2C, the difference in the Bragg wavelength for the TE mode between the front portion 21 and the rear portion 22 is approximately equal to the difference in the Bragg wavelength for the TM mode between the front portion 21 and the rear portion 22. Namely, $\lambda_{bf}^{TE} \neq \lambda_{br}^{TE}$
$\lambda_{bf}^{TM} \neq \lambda_{br}^{TM}$
$\lambda_{bf}^{TE} - \lambda_{br}^{TE} \approx \lambda_{bf}^{TM} - \lambda_{br}^{TM}$ Which of the TE mode and the TM mode oscillates depends on asymmetry, such as the end facet phase and fine unevenness of the diffraction grating.

Figure 3A:
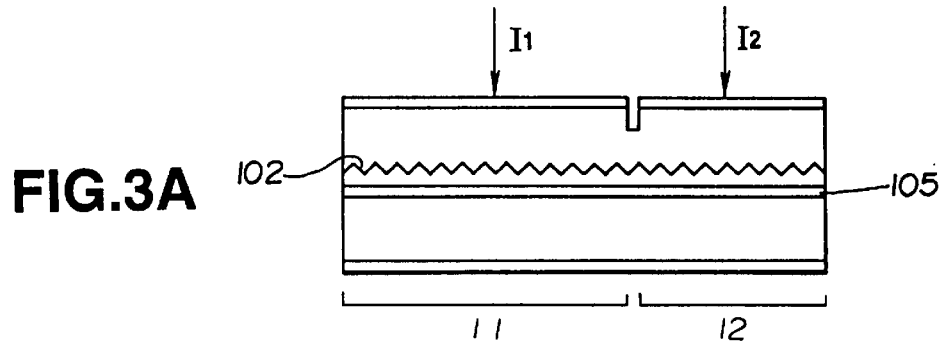
FIG. 3A is a cross-sectional view of an optical semiconductor apparatus of the present invention for illustrating oscillation polarization mode switching.
Figure 3B:
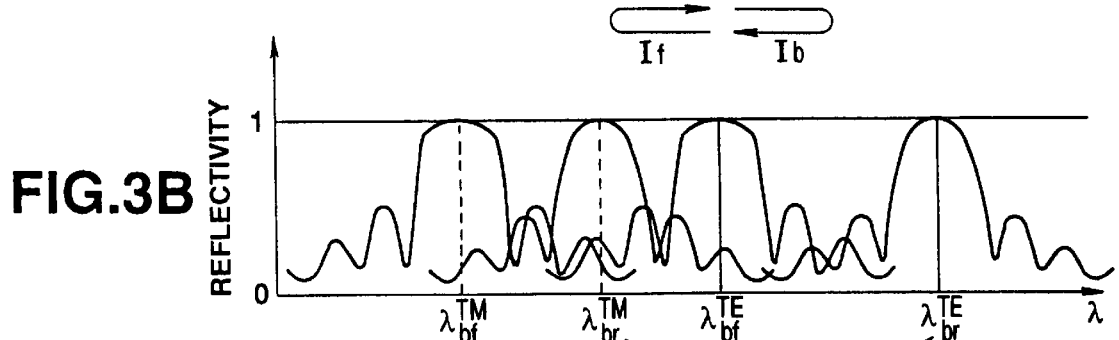
FIG. 3B is a graph illustrating a state in which Bragg wavelengths for the TE mode and the TM mode in a front portion are different from each other and Bragg wavelengths for the TE mode and the TM mode in a rear portion are different from each other.

In contrast, in a state in which current is uniformly injected into the device of this embodiment as illustrated in 3A, a difference between propagation constants for the TE mode and the TM mode in the front portion 11 differs from a difference between propagation constants for the TE mode and the TM mode in the rear portion 12, due to the difference in the ridge width between the front portion 11 and the rear portion 12. At the same time, differences $\lambda_b^{TE} - \lambda_b^{TM}$ between the Bragg wavelengths of the TE mode and the TM mode for the same grating 102 differ from each other between the front portion 11 and the rear portion 12. In this embodiment, the difference in the front portion 11 is 19 Å and the difference in the rear portion 12 is 23 Å, as illustrated in FIG. 3B. More specifically, the differences between the Bragg wavelengths for the two different modes differ from each other, and the difference amount between those differences between the two different light waveguide portions 11 and 12 is set larger than a stop band width for one of those polarization modes. Under such a condition, which of the TE mode and the TM mode oscillates depends on specifications of the individual devices, such as coupling efficiency due to the diffraction grating 102, the end facet phase, and fine unevenness of the diffraction grating 102. In FIG. 3A, the grating 102 is depicted as formed above the active layer 105, corresponding to the structure of FIG. 2A, but the operation in the structure of FIG. 3A is the same as that of FIGS. 1A and 1B.

Figure 3C:
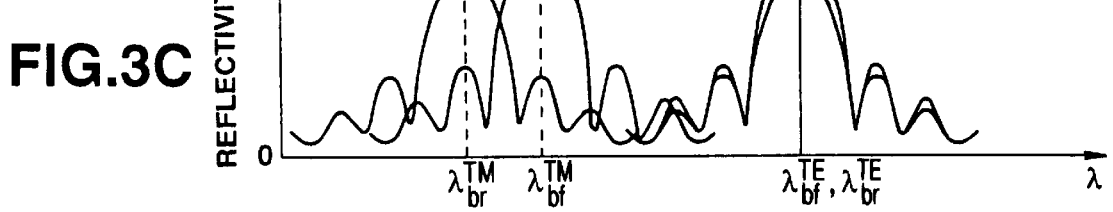
FIG. 3C is a graph illustrating a state in which Bragg wavelengths for the TM mode in front and rear portions are different from each other and Bragg wavelengths for the TE mode in front and rear portions are equal to each other.
Figure 3D:
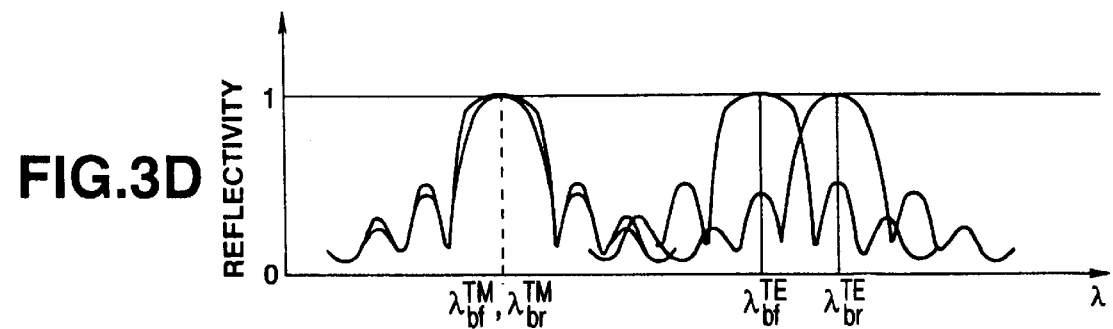
FIG. 3D is a graph illustrating a state in which Bragg wavelengths for the TE mode in front and rear portions are different from each other and Bragg wavelengths for the TM mode in front and rear portions are equal to each other.

In the device of this embodiment, two operation points can be considered as illustrated in FIGS. 3C and 3D, when current is unevenly injected. In a first uneven-injection state of FIG. 3C, the Bragg wavelengths $\lambda_{bf}^{TE}$ and $\lambda_{br}^{TE}$ for the TE mode are approximately equal between the front portion 11 and the rear portion 12, while the Bragg wavelengths $\lambda_{bf}^{TM}$ and $\lambda_{br}^{TM}$ for the TM mode differ from each other between the front portion 11 and the rear portion 12. Namely, $\lambda_{bf}^{TE} \approx \lambda_{br}^{TE}$
$\lambda_{bf}^{TM} \neq \lambda_{br}^{TM}$ In this state, reflection loss is small for light near the Bragg wavelengths for the TE mode, which coincide with each other, and gain for satisfying the gain condition of laser oscillation is small. In contrast, light near the Bragg wavelength for the TM mode in the front portion 11 is remote from light at the Bragg wavelength for the TM mode in the rear portion 12, and hence reflection loss occurs for the TM mode and gain for satisfying the gain condition of laser oscillation rises. Thus, in the state in which the Bragg wavelengths for the TE mode coincide with each other, oscillation occurs in the TE mode.

Oscillation occurs at a wavelength which is near the Bragg wavelength for the TE mode and satisfies the phase condition. In the first embodiment, when the Bragg wavelengths $\lambda_{bf}^{TE}$ and $\lambda_{br}^{TE}$ for the TE mode coincide with each other at 1553.0 nm, the Bragg wavelength for the TM mode in the front portion 11 is 1551.1 nm and that for the TM mode in the rear portion 12 is 1550.7 nm.

In a second uneven-injection state of FIG. 3D, the Bragg wavelengths $\lambda_{bf}^{TM}$ and $\lambda_{br}^{TM}$ for the TM mode are coincident with each other between the front portion 11 and the rear portion 12, while the Bragg wavelengths $\lambda_{bf}^{TE}$ and $\lambda_{br}^{TE}$ for the TE mode differ from each other between the front portion 11 and the rear portion 12. Namely, $\lambda_{bf}^{TE} \neq \lambda_{br}^{TE}$
$\lambda_{bf}^{TM} \approx \lambda_{br}^{TM}$ In this state, reflection loss increases for the TE mode, while reflection loss decreases for the TM mode. Therefore, in this embodiment wherein gain for the TM mode is also increased by the following mechanism, oscillation occurs in the TM mode. This oscillation wavelength in the TM mode is also near the Bragg wavelength for the TM mode and satisfies the phase condition.

In an ordinary quantum well semiconductor laser, gain of an active layer for the TE mode is large while that for the TM mode is small. In this embodiment, however, loss imparted to the TE mode is made larger than that imparted to the TM mode, and oscillation in the TM mode is likely to occur. For this purpose, the Bragg wavelength is set near the gain peak wavelength for the TM mode which is shorter than than the gain peak wavelength for the TE mode. Further, the coupling coefficient of Bragg reflection due to a diffraction grating for the TE mode is generally larger than that for the TM mode, but this difference is smaller than a difference in reflectivities of end-facet reflection between the TE and the TM mode. In this embodiment, since the antireflection coatings of $SiO_2$ are provided at the both opposite end facets, this structure also contributes to decrease in a difference between threshold gains for the TE and the TM mode. In other words, the antireflection coating is provided at the end facet in the front portion 11 for the purpose of reducing the effect of the end-facet reflection.

Further, the products κL of coupling coefficients κ due to the diffraction grating and cavity lengths L in the front portion 11 and the rear portion 12 are respectively set to about 2 (two). In both of the front portion 11 and the rear portion 12, the transverse mode is a 0-th order mode. Namely, higher transverse modes are cut off, and a single mode is established.

Second Embodiment

Figure 4:
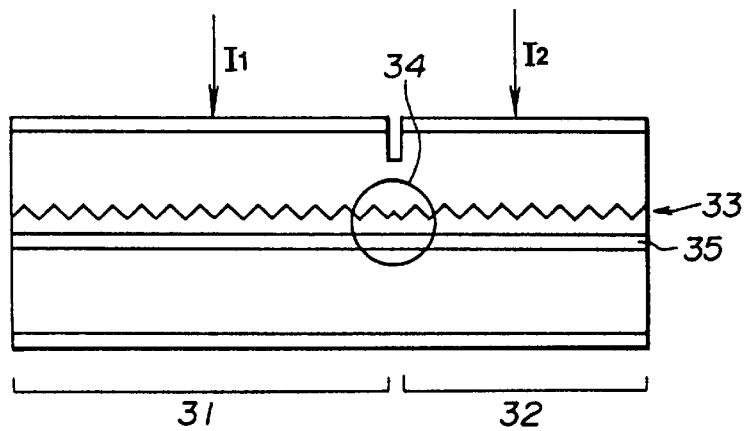
FIG. 4 is a cross-sectional view illustrating a second embodiment of an optical semiconductor apparatus having a grating with a phase shift section according to the present invention.

A second embodiment of the present invention, which is a distributed feedback semiconductor laser apparatus with a phase shift section, will be described with reference to FIG. 4. In FIG, 4. reference numeral 31 designates a distributed feedback (DFB) portion on a light emission side, and reference numeral 32 designates a distributed feedback (DFB) portion on a modulation-electrode side. The layer structure of this embodiment is the same as that of the first embodiment (a grating 33 is depicted as formed above an active layer 35, but the operation of the second embodiment is substantially the same as that of the first embodiment). A difference between the first embodiment and the second embodiment is in that a phase shift section 34 of a λ/4 shift is introduced into a boundary portion of the diffraction grating 33 between the DFB portions 31 and 32.

Similar to the first embodiment, a ridge is formed in the DFB portion 31 on the light emission side to set the width of an active layer at 2 μm, and another ridge is formed in the DFB portion 32 on the modulation-electrode side to set the width of the active layer at 5 μm. Those ridges are surrounded by high-resistance InP layers. Electrodes for injecting currents $I_1$ and $I_2$ therethrough and antireflection coatings are formed in the same manner as the first embodiment.

During operation of the second embodiment, the oscillation wavelength in the TE or the TM mode does not fall outside the stop band because of the introduction of the λ/4 shift section 34. The oscillation wavelength is surely positioned near the Bragg wavelength within the stop band. Other principles of operation and the like are the same as the first embodiment.

Third Embodiment

Figure 5:
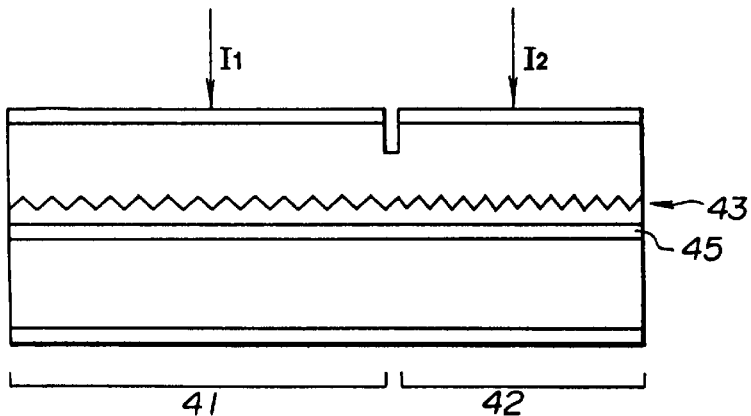
FIG. 5 is a cross-sectional view illustrating a third embodiment of an optical semiconductor apparatus having gratings with different pitches according to the present invention.

A third embodiment of the present invention, which is a distributed feedback semiconductor laser apparatus with regions having different diffraction gratings, will be described with reference to FIG. 5. In FIG. 5, reference numeral 41 designates a distributed feedback (DFB) portion on a light emission side, and reference numeral 42 designates a distributed feedback (DFB) portion on a modulation-electrode side. The layer structure of this embodiment is also the same as that of the first embodiment (a grating 43 is depicted as formed above an active layer 45, but the operation of the third embodiment is substantially the same as that of the first embodiment). One difference between the third embodiment and the first embodiment is that pitches of the diffraction grating 43 are slightly different between the DFB portions 41 and 42. The pitch of the grating 43 is 234.8 nm in the light emission portion 41 having a narrow ridge width, and the pitch of the grating 43 is 234.0 nm in the modulation-electrode portion 42 having a wide ridge width. The difference is about 0.3%.

Similar to the first embodiment, a ridge is formed in the DFB portion 41 on the light emission side to set the width of an active layer at 2 μm, and another ridge is formed in the DFB portion 42 on the modulation-electrode side to set the width of the active layer at 5 μm. Those ridges are surrounded by high-resistance InP layers. Electrodes and antireflection coatings are also formed in the same manner as the first embodiment.

The operation of the third embodiment features that Bragg wavelengths for the TM mode in the light emission portion 41 and the modulation-electrode portion 42 are approximately equal to each other in a state in which current is substantially uniformly injected, since there are two different grating pitches (see FIG. 3D). When current is injected in a slightly uneven manner, Bragg wavelengths for the TE mode in the light emission portion 41 and the modulation-electrode portion 42 in turn become equal to each other (see FIG. 3C). Other principles of operation and the like are the same as the first embodiment.

Fourth Embodiment

Figure 6:
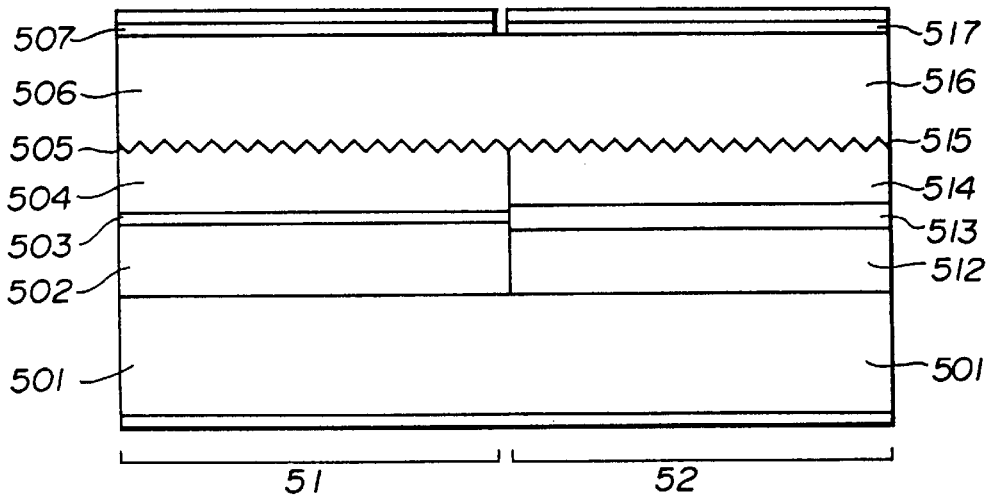
FIG. 6 is a cross-sectional view illustrating a fourth embodiment of an optical semiconductor apparatus having active layers with different layer thicknesses according to the present invention.

A fourth embodiment of the present invention, which is a distributed feedback semiconductor laser apparatus with regions having different layer structures, will be described with reference to FIG. 6. In FIG. 6, reference numeral 51 designates a first distributed feedback (DFB) portion, and reference numeral 52 designates a second distributed feedback (DFB) portion.

In the first DFB portion 51, an n-type $In_{0.79}Ga_{0.21}As_{0.45}P_{0.55}$ lower light guide layer 502 having a thickness of 0.3 μm, an intrinsic (i-) $In_{0.59}Ga_{0.41}As_{0.87}P_{0.13}$ active layer 503 having a thickness of 0.05 μm, and a p-type $In_{0.79}Ga_{0.21}As_{0.45}P_{0.55}$ upper light guide layer 504 having a thickness of 0.3 μm are laid down on an n-type InP substrate 501, and a diffraction grating 505 of a pitch 237 nm is formed. Then, a p-type InP clad layer 506 having a thickness of 1.8 μm, and a p-type $In_{0.59}Ga_{0.41}As_{0.9}P_{0.1}$ contact layer 507 are laid down on the grating 505.

In the second DFB portion 52, an n-type $In_{0.79}Ga_{0.21}As_{0.45}P_{0.55}$ lower light guide layer 512 having a thickness of 0.25 μm, an intrinsic (i-) $In_{0.59}Ga_{0.41}As_{0.87}P_{0.13}$ active layer 513 having a thickness of 0.15 μm, and a p-type $In_{0.79}Ga_{0.21}As_{0.45}P_{0.55}$ upper light guide layer 514 having a thickness of 0.25 μm are laid down on the n-type InP substrate 501, and a diffraction grating 515 of a pitch 237 nm is formed. Then, a p-type InP clad layer 516 having a thickness of 1.8 μm, and a p-type $In_{0.59}Ga_{0.41}As_{0.9}P_{0.1}$ contact layer 517 are grown on the grating 515.

In the fourth embodiment, a ridge is formed in each of the DFB portions 51 and 52 to set the width of the active layers 503 and 513 at 3 μm, and the ridge is surrounded by high-resistance InP layers. Electrodes and antireflection coatings are also formed in the same manner as the first embodiment.

In this embodiment, the ridge widths in the DFB portions 51 and 52 are equal to each other, but a difference between propagation constants for the TE mode and the TM mode in the first DFB portion 51 is made different from that in the second IDFB portion 52 by the difference in the layer structure. In the first DFB portion 51, the Bragg wavelength for the TE mode is 1550.12 nm and the Bragg wavelength for the TM mode is 1547.42 nm. On the other hand, in the second DFB portion 52, the Bragg wavelength for the TE mode is 1566.29 nm and the Bragg wavelength for the TM mode is 1561.74 nm.

To compensate for the difference between the Bragg wavelengths in the two DFB portions 51 and 52, the grating pitch in the second DFB portion 52 may be made a little (about 1%) longer than that in the first DFB portion 51. In this case, the grating pitch in the second DFB portion 52 is 239 nm. Thereby, the amount of current, which should be injected until the Bragg wavelengths for the TE mode or the TM mode become equal between the first DFB portion 51 and the second DFB portion 52, can be reduced. Other principles of operation and the like are the same as the first embodiment.

Fifth Embodiment

Figure 7:
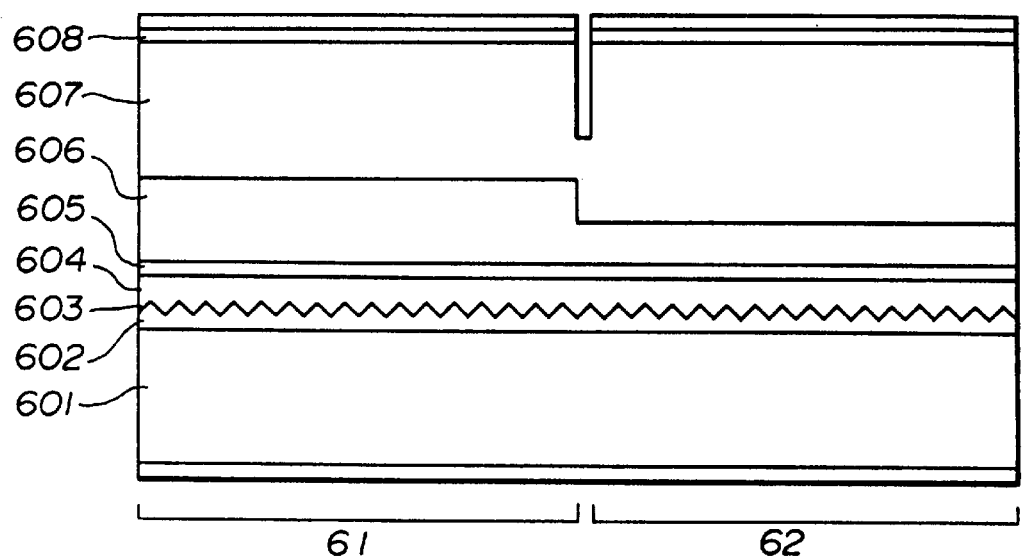
FIG. 7 is a cross-sectional view illustrating a fifth embodiment of an optical semiconductor apparatus having light confinement layers with different layer thicknesses according to the present invention.

A fifth embodiment of the present invention, which is a distributed feedback semiconductor laser apparatus with light-confining layers having different thicknesses, will be described with reference to FIG. 7. In FIG. 7, reference numeral 61 designates a first distributed feedback (DFB) portion, and reference numeral 62 designates a second distributed feedback (DFB) portion.

On an n-type InP substrate 601, an n-type $In_{0.86}Ga_{0.14}As_{0.31}P_{0.69}$ layer 602 having a thickness of 0.2 μm is formed, and a diffraction grating 603 having a depth of 0.15 μm and a pitch of 238 nm is formed on the layer 602. Then, an n-type $In_{0.79}Ga_{0.21}As_{0.45}P_{0.55}$ lower light guide layer 604 having a thickness of 0.2 μm, an intrinsic (i-) $In_{0.59}Ga_{0.41}As_{0.87}P_{0.13}$ active layer 605 having a thickness of 0.05 μm, and a p-type $In_{0.79}Ga_{0.21}As_{0.45}P_{0.55}$ upper light guide layer 606 having a thickness of 0.4 μm are laid down on the n-type InP substrate 601. After that, patterning is performed by photolithography, and the upper light guide layer 606 is partially (a portion in the DFB portion 62 on the right-hand side in FIG. 7) etched down to a depth of 0.2 μm. Then, a p-type InP clad layer 607 having a thickness of 1.8 μm, and a p-type $In_{0.59}Ga_{0.41}As_{0.9}P_{0.1}$ contact layer 608 are deposited.

In the fifth embodiment, a ridge is formed in each of the DFB portions 61 and 62 to set the width of the active layer 605 at 3 μm, and the ridge is surrounded by high-resistance InP layers. Electrodes and antireflection coatings are also formed in the same manner as the first embodiment.

Also in this embodiment, widths of the ridges in the DFB portions 61 and 62 are equal to each other, but a difference between propagation constants for the TE mode and the TM mode in the first DFB portion 61 is made different from that in the second DFB portion 62 by the difference in the layer structure. In the first DFB portion 61, the Bragg wavelength for the TE mode is 1548.05 nm and the Bragg wavelength for the TM mode is 1546.38 nm. On the other hand, in the second DFB portion 62, the Bragg wavelength for the TE mode is 1535.53 nm and the Bragg wavelength for the TM mode is 1533.53 nm.

Also in this embodiment, to compensate for the difference between the Bragg wavelengths in the two DFB portions 61 and 62, the grating pitch in the second DFB portion 62 may be made a little (about 1%) longer than that in the first DFB portion 61. In this case, the grating pitch in the second DFB portion 62 is 240 nm. Thus, the amount of current, which should be injected until the Bragg wavelengths for the TE mode or the TM mode become equal to each other between the first DFB portion 61 and the second DFB portion 62, can be reduced. Other principles of operation and the like are the same as the first embodiment.

Sixth Embodiment

Figure 8:
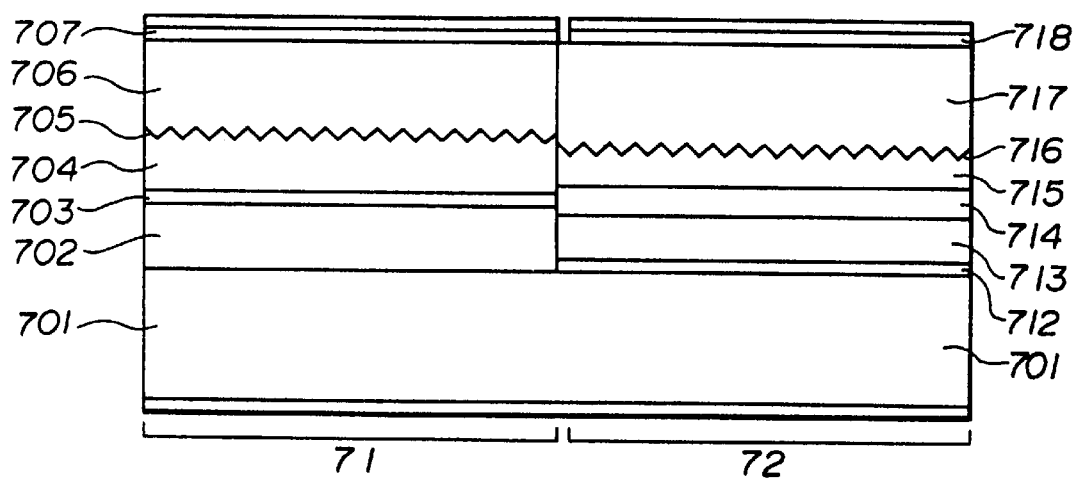
FIG. 8 is a cross-sectional view illustrating a sixth embodiment of an optical semiconductor apparatus having waveguides with different layer structures according to the present invention.

A sixth embodiment of the present invention, which is a distributed feedback semiconductor laser apparatus with two DFB portions having light-confining layers of different thicknesses, will be described with reference to FIG. 8. In FIG. 8, reference numeral 71 designates a first distributed feedback (DFB) portion, and reference numeral 72 designates a second distributed feedback (DFB) portion.

In the first DFB portion 71, an n-type $In_{0.79}Ga_{0.21}As_{0.45}P_{0.55}$ lower light guide layer 702 having a thickness of 0.3 μm, an intrinsic (i-) $In_{0.59}Ga_{0.41}As_{0.87}P_{0.13}$ active layer 703 having a thickness of 0.05 μm, and a p-type $In_{0.79}Ga_{0.21}As_{0.45}P_{0.55}$ upper light guide layer 704 having a thickness of 0.3 μm are laid down on an n-type InP substrate 701, and a diffraction grating 705 of a pitch 237 nm is formed. Then, a p-type InP clad layer 706 having a thickness of 1.8 μm, and a p-type $In_{0.59}Ga_{0.41}As_{0.9}P_{0.1}$ contact layer 707 are laid down on the grating 705.

In the second DFB portion 72, an n-type InP buffer layer 712 having a thickness of 0.08 μm, an n-type $In_{0.79}Ga_{0.21}As_{0.45}P_{0.55}$ lower light guide layer 713 having a thickness of 0.2 μm, an intrinsic (i-) $In_{0.59}Ga_{0.41}As_{0.87}P_{0.13}$ active layer 714 having a thickness of 0.09 μm, and a p-type $In_{0.79}Ga_{0.21}As_{0.45}P_{0.55}$ upper light guide layer 715 having a thickness of 0.2 μm are laid down on the n-type InP substrate 701, and a diffraction grating 716 of a pitch of 237 nm is formed. Then, a p-type InP clad layer 717 having a thickness of 1.8 μm, and a p-type $In_{0.59}Ga_{0.41}As_{0.9}P_{0.1}$ contact layer 718 are laid down on the grating 716.

In the sixth embodiment, a ridge is formed in each of the DFB portions 71 and 72 to set the widths of the active layers 703 and 714 at 3 μm, and those ridges are surrounded by high-resistance InP layers. Electrodes and antireflection coatings are also formed in the same manner as the first embodiment.

Also in this embodiment, widths of the ridges in the DFB portions 71 and 72 are equal to each other, but a difference between propagation constants for the TE mode and the TM mode in the first DFB portion 71 is made different from that in the second DFB portion 72 by the difference in the layer structure. In the first DFB portion 71, the Bragg wavelength for the TE mode is 1550.12 nm and the Bragg wavelength for the TM mode is 1547.42 nm. On the other hand, in the second DFB portion 72, the Bragg wavelength for the TE mode is 1548.23 nm and the Bragg wavelength for the TM mode is 1543.72 nm.

In this embodiment, the Bragg wavelengths for the TE mode in the two DFB portions 71 and 72 are relatively close to each other, so that the Bragg wavelengths for the TE mode are equal under the current-injection condition of an approximately uniform carrier density. The Bragg wavelengths for the TM mode become equal to each other when current is injected in a slightly uneven manner which deviates from the uniform current-injection condition. Other principles of operation and the like are the same as the first embodiment.

Seventh Embodiment

A seventh embodiment of the present invention, which is a distributed feedback semiconductor laser apparatus with mixed quantum well layers, will be described with reference to FIGS. 9A and 9B. In FIG. 9B, reference numeral 81 designates a first distributed feedback (DFB) portion, and reference numeral 82 designates a second distributed feedback (DFB) portion.

Figure 9A:
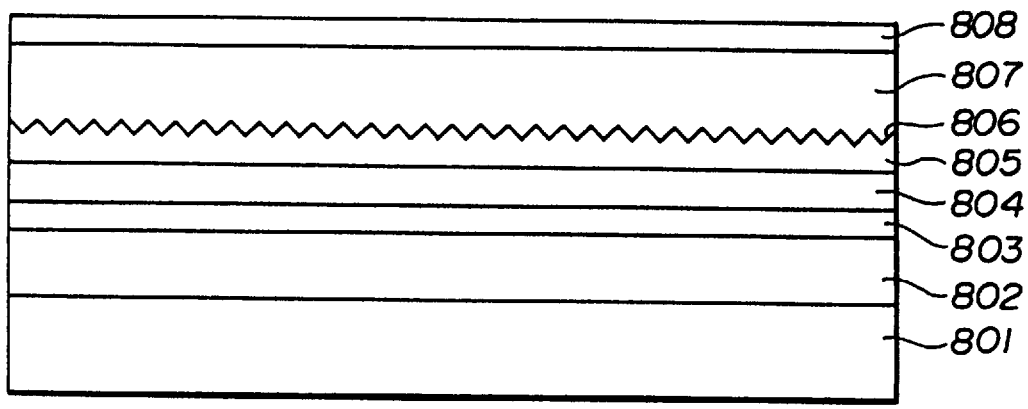
FIG. 9A is a cross-sectional view illustrating a seventh embodiment of an optical semiconductor apparatus prior to mixing treatment according to the present invention.
Figure 9B:
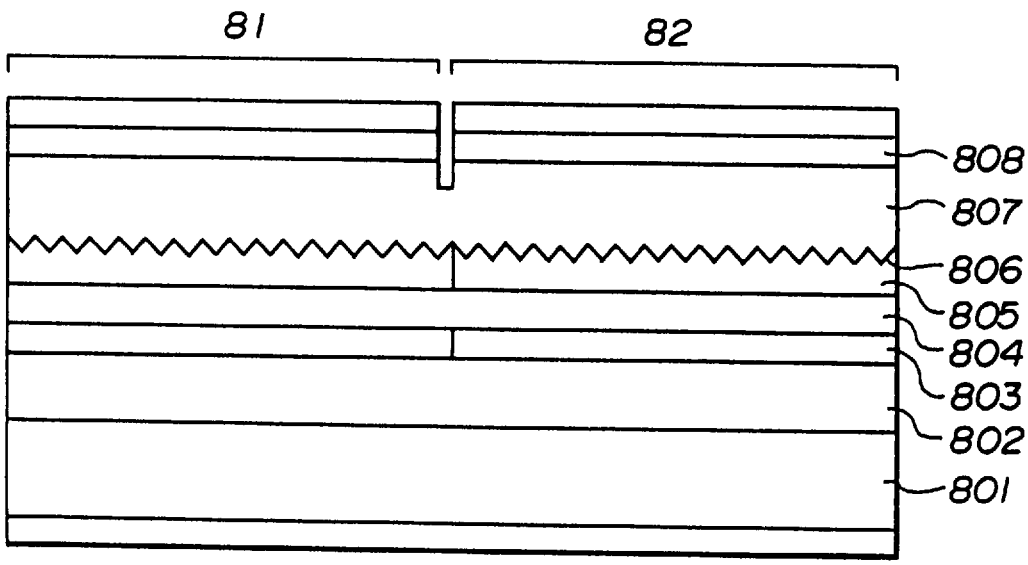
FIG. 9B is a cross-sectional view illustrating the seventh embodiment after the mixing treatment is performed according to the present invention.

Initially, as shown in FIG. 9A, on an n-type InP substrate 801, an n-type $In_{0.79}Ga_{0.21}As_{0.45}P_{0.55}$ lower light guide layer 802 having a thickness of 0.3 μm, an active layer 803 of a strained quantum well structure, a p-type $In_{0.79}Ga_{0.21}As_{0.45}P_{0.55}$ upper light guide layer 804 having a thickness of 0.2 μm, and a light guide layer 805 of a multiple quantum well structure, which consists of ten pairs of p-type $In_{0.73}Ga_{0.27}As_{0.59}P_{0.41}$ well layers (thickness: 6 nm) and p-type $In_{0.86}Ga_{0.14}As_{0.31}P_{0.69}$ barrier layers (thickness: 10 nm) are formed, and a diffraction grating 806 having a pitch of 237 nm is formed on the layer 805. Then, a p-type InP clad layer 807 having a thickness of 1.8 μm, and a p-type $In_{0.59}Ga_{0.41}As_{0.09}P_{0.1}$ contact layer 808 are laid down.

Then, as illustrated in FIG. 9B, portions (in the DFB portion 82) of the active layer 803 and the quantum well guide layer 805 are mixed or disordered by bombardment with hydrogen ions. Then, a ridge is formed in each of the DFB portions 81 and 82 to set the width of the active layer 803 at 3 μm, and the ridge is surrounded by high-resistance InP layers. Electrodes and antireflection coatings are also formed in the same manner as the first embodiment.

In this embodiment, the quantum well light guide layer 805 and the quantum well active layer 803 are mixed in the DFB portion 82, but are not mixed in the non-mixed DFB portion 81. As a result, depending on if the quantum well structure is mixed or not, a difference between the Bragg wavelengths for the TE mode and the TM mode in the mixed DFB portion 82 differs from a difference between the Bragg wavelengths for the TE mode and for the TM mode in the non-mixed DFB portion 81. Other principles of operation and the like are the same as the first embodiment.

In this embodiment, the quantum well structure is mixed by the hydrogen-ion bombardment, but other methods may be used. For example, the mixing may be performed by heat treatment after an insulator film is partially formed on a wafer, or the mixing may be conducted by diffusion of an impurity. Further, in this embodiment, the quantum well structures of the active layer 803 and the light guide layer 805 are both mixed, but only one of them, e.g., the light guide layer 805, may be mixed. Moreover, in this embodiment, the grating 806 is formed on the quantum well light guide layer 805, but the grating may be formed on the layer under the active layer 803.

Furthermore, to increase a difference between the difference between Bragg wavelengths for the TE mode and the TM mode in the non-mixed DFB portion 81 and the difference between Bragg wavelengths for the TE mode and the TM mode in the mixed DFB portion 82, or to compensate for that difference, the in-plane confinement width may be varied between the non-mixed DFB portion 81 and the mixed DFB portion 82, similar to the first embodiment.

Eighth Embodiment

Figure 10A:
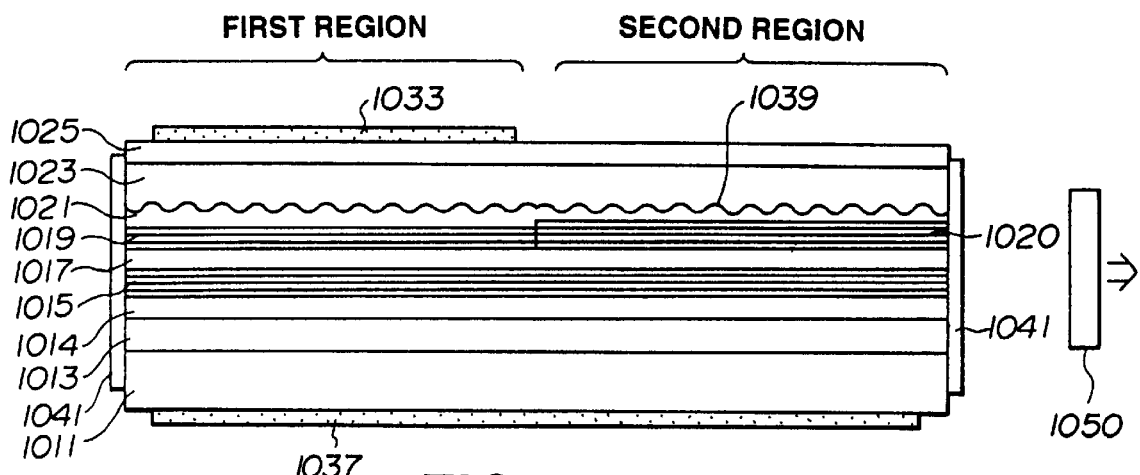
FIG. 10A is a cross-sectional view illustrating an eighth embodiment of an optical semiconductor apparatus having first and second refractive index regulating layers and an electrode for controlling the first refractive index regulating layer according to the present invention.
Figure 10B:
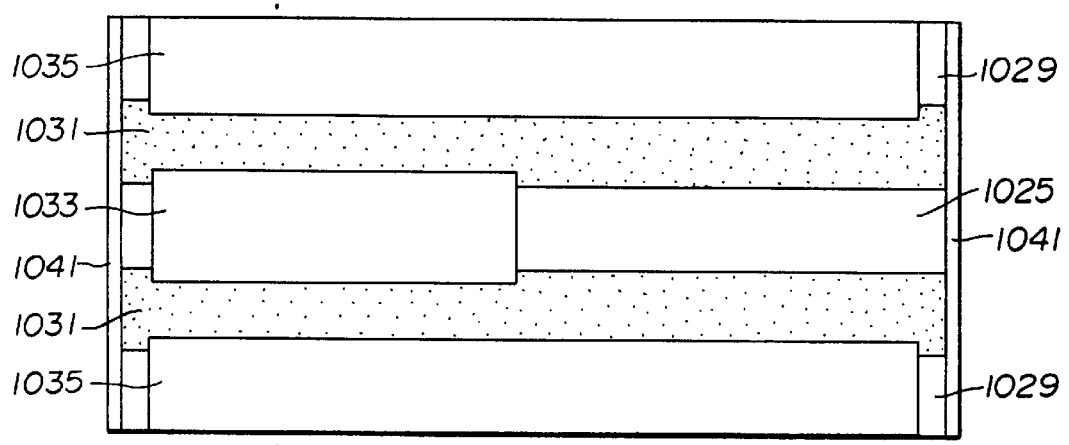
FIG. 10B is a plan view illustrating the eighth embodiment.

An eighth embodiment of the present invention, which is an InP/InGaAsP series semiconductor laser apparatus, will be described with reference to FIGS. 10A–10C and FIGS. 11A–11C. FIG. 10A is a cross-sectional view taken along a cavity direction of the semiconductor laser apparatus, FIG. 10B is a plan view, and FIG. 10C is a cross-sectional view taken along a line a–a' in FIG. 10B which is perpendicular to the cavity direction.

The device has the following structure. In FIG. 10A, reference numeral 1011 designates a p-type InP substrate. Reference numeral 1013 designates a p-type InP buffer layer. Reference numeral 1014 designates a p-type InGaAsP light guide layer whose thickness is 0.1 $\mu$m and whose bandgap wavelength is 1.15 $\mu$m. Reference numeral 1015 designates an active layer of a multiple quantum well structure. Reference numeral 1017 designates an n-type InP barrier layer having a thickness of 0.15 $\mu$m. Reference numeral 1019 designates a first refractive index regulating layer of a multiple quantum well structure formed in a first region. Reference numeral 1020 designates a second refractive index regulating layer of a multiple quantum well structure formed in a second region. Reference numeral 1021 designates a p-type InGaAsP grating layer whose thickness is 0.15 $\mu$m and whose bandgap wavelength is 1.15 $\mu$m. Reference numeral 1023 designates a p-type InP clad layer. Reference numeral 1025 designates a p-type $In_{0.53}P_{0.47}As$ contact layer.

Figure 10C:
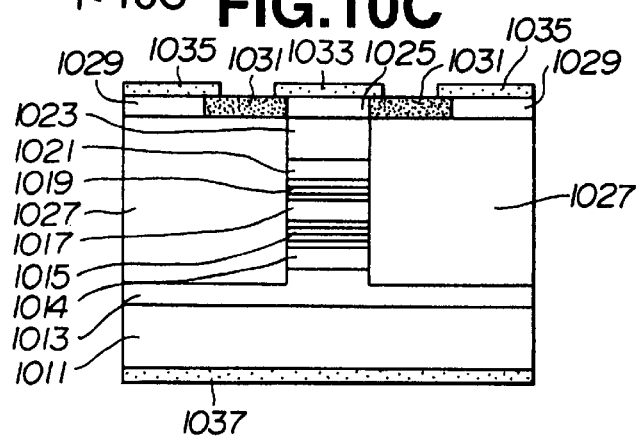
FIG. 10C is a cross-sectional view of FIG. 10B taken along line a–a' in FIG. 10B.

In FIG. 10C, reference numeral 1027 designates an n-type InP burying layer. In FIGS. 10B and 10C, reference numeral 1029 designates an n-type $In_{0.53}P_{0.47}As$ contact layer. Reference numeral 1031 designates an insulator layer of $SiN_x$. Reference numerals 1033 and 1037 respectively designate Cr/AuZnNi/Au layers which are p-side electrodes. Reference numeral 1035 designates an AuGeNi/Au layer which is an n-side electrode. A diffraction grating 1039 (its pitch: 240 nm) with a $\lambda/4$ phase shift section is formed on the grating layer 1021, and layers 1041 of $SiO_x$ are deposited as an antireflection coating on both opposite end facets.

The active layer 1015 having a strained quantum well structure consists of ten pairs of intrinsic (i-) $In_{0.27}Ga_{0.73}As$ well layers (thickness: 10 nm) and i-InGaAsP barrier layers (thickness: 10 nm, and composition wavelength: 1.15 $\mu$m) and a pair of intrinsic InGaAsP SCH layers (thickness: 20 nm, and composition wavelength: 1.15 $\mu$m). The bandgap wavelength thereof is 1.55 $\mu$m. Since a tensile strain is introduced into the active layer 1015, transition energy between the ground level of heavy holes and the ground level of electrons is approximately equal to transition energy between the ground level of light holes and the ground level of electrons. Therefore, oscillation threshold for the TM mode is lowered and the polarization mode switching can be efficiently performed, compared with a DFB laser without any strain.

Each of the index regulating layers 1019 and 1020 having a strained quantum well structure consists of seven (the layer 1019) or eight (the layer 1020) pairs of intrinsic (i-) $In_{0.53}Ga_{0.47}As$ well layers (thickness: 4 nm) and i-InGaAsP barrier layers (thickness: 10 nm, and composition wavelength: 1.15 $\mu$m) and a pair of intrinsic InGaAsP SCH layers (thickness: 24 nm, and composition wavelength: 1.15 $\mu$m). The bandgap wavelength thereof is 1.45 $\mu$m. The waveguide width in each of the first and second regions is 2.5 $\mu$m.

Figure 11A:
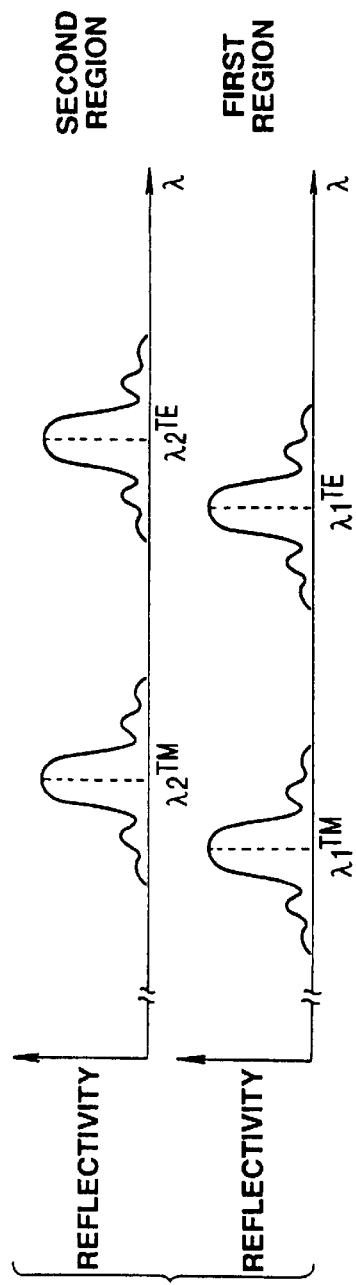
FIG. 11A is a graph illustrating a state of the eighth embodiment in which Bragg wavelengths for the TE mode and the TM mode in a first region are different from each other and Bragg wavelengths for the TE mode and the TM mode in a second region are different from each other.
Figure 11B:
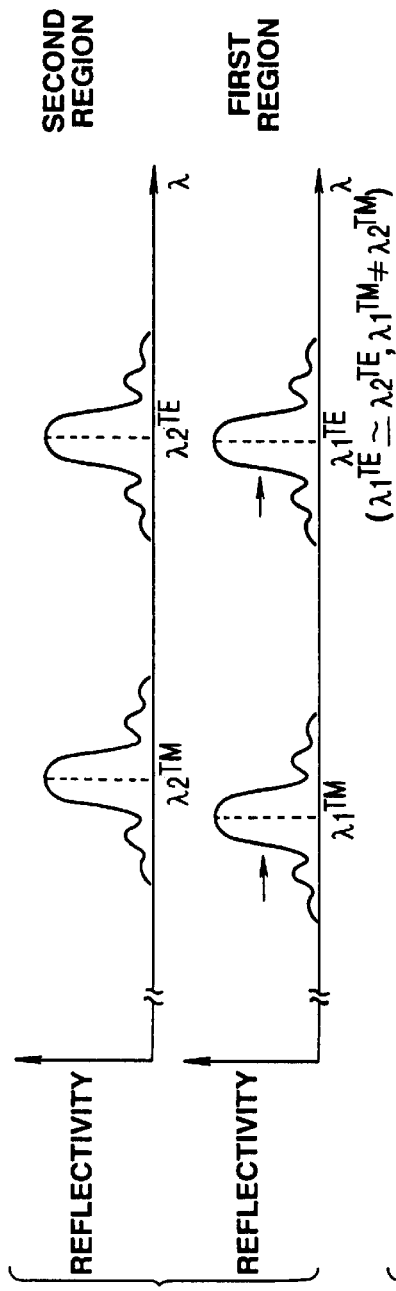
FIG. 11B is a graph illustrating a state of the eighth embodiment in which Bragg wavelengths for the TM mode in first and second regions are different from each other and Bragg wavelengths for the TE mode in first and second regions are equal to each other.
Figure 11C:
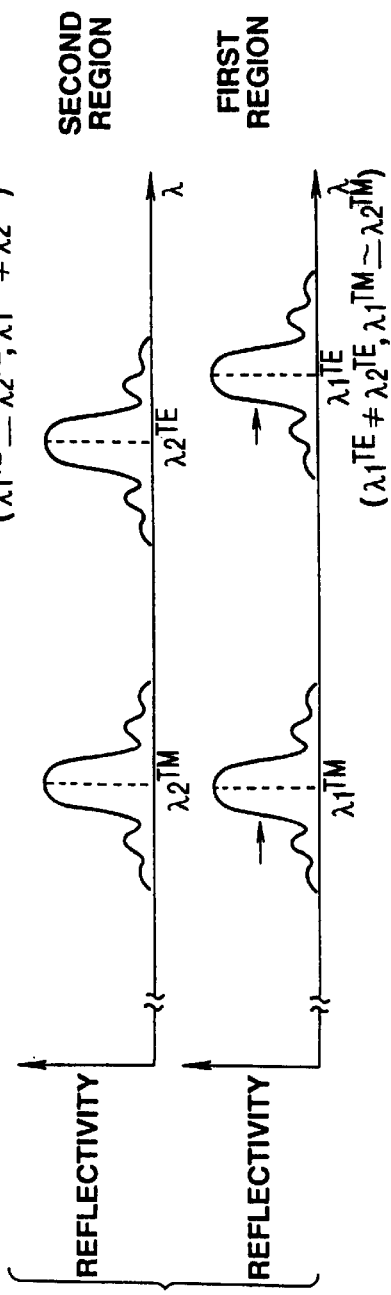
FIG. 11C is a graph illustrating a state of the eighth embodiment in which Bragg wavelengths for the TE mode in first and second regions are different from each other and Bragg wavelengths for the TM mode in first and second regions are equal to each other.
Figure 12A:
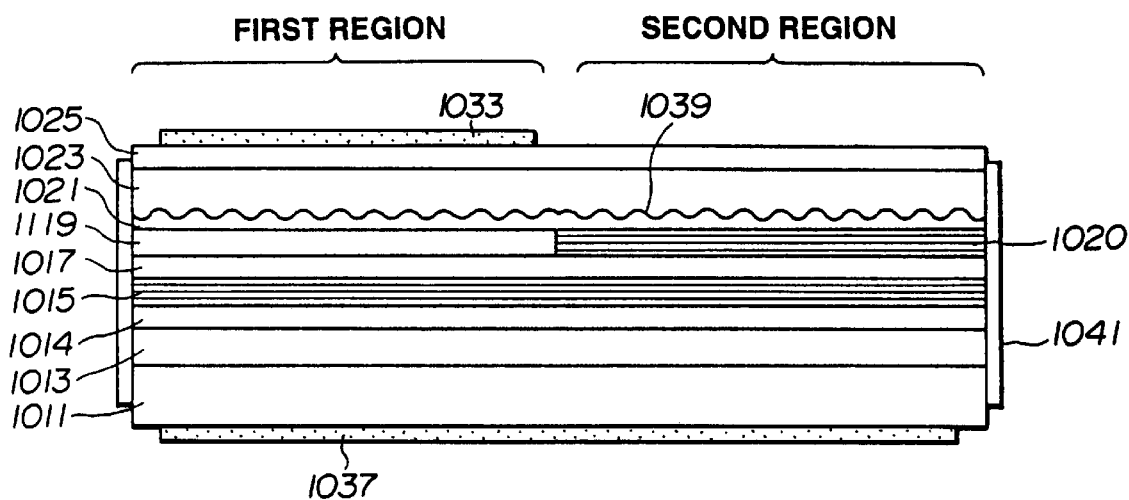
FIG. 12A is a cross-sectional view illustrating a ninth embodiment of an optical semiconductor apparatus according to the present invention.
Figure 12B:
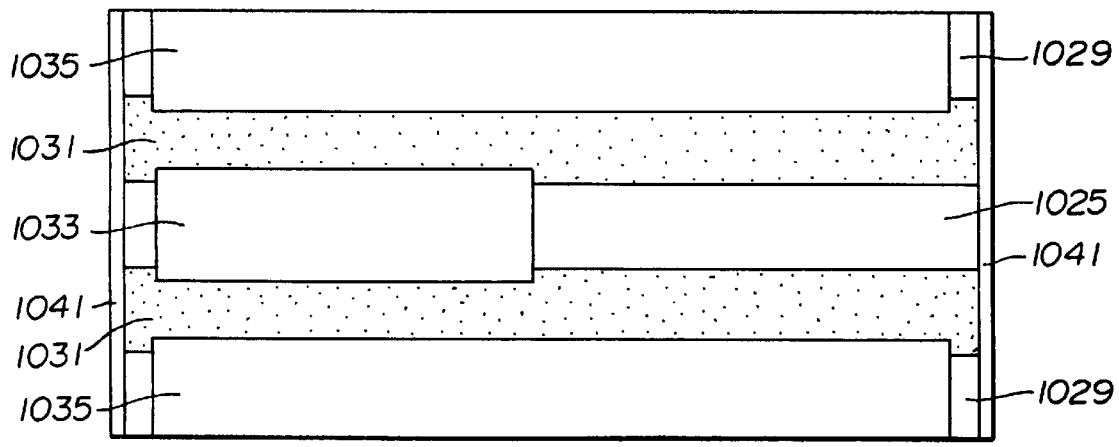
FIG. 12B is a plan view illustrating the ninth embodiment.

Turning to FIGS. 11A–11C, Bragg wavelengths for the TE mode and the TM mode in the first region are respectively indicated by $\lambda_1^{TE}$ and $\lambda_1^{TM}$, and those in the second region are respectively indicated by $\lambda_2^{TE}$ and $\lambda_2^{TM}$.

When appropriate bias currents are injected into the active layer 1015 across the electrodes 1035 and 1037, relationships between the Bragg wavelength and the reflectivity are as illustrated in FIG. 11A. Since the layer thickness of the index regulating layer 1020 in the second region is slightly larger than that in the first region, the effective or equivalent refractive index of the second region is larger than that of the first region. The Bragg wavelengths of the first region are totally on a shorter wavelength side than those of the second region, though the Bragg wavelength differences between the TE mode and the TM mode are slightly different from each other between the first and second regions. A wavelength range having a large reflectivity is located about each Bragg wavelength.

When a reverse voltage is applied to the first index regulating layer 1019 across the electrodes 1033 and 1035, its bandgap is narrowed and the refractive index of the layer 1019 increases. In the quantum well structure, a change in the bandgap or in the refractive index relative to the applied electric field has a polarization mode dependency, and the change for the TE mode is larger than that for the TM mode. Such a change in the bandgap of the quantum well structure due to an electric field is called the quantum confinement Stark effect (QCSE). Therefore, as the amount of the applied reverse voltage increases, the effective refractive index in the first region or the Bragg wavelength thereof increases. Here, the increase amount of the Bragg wavelength for the TE mode is larger than that for the TM mode. As a result, a state, in which the Bragg wavelengths for the TE mode coincide with each other (see FIG. 11B), first appears, and the cavity loss for the TE mode or the threshold gain therefor is lowered. Thus, oscillation occurs in the TE mode. As the reverse voltage is further increased, a state, in which the Bragg wavelengths for the TM mode coincide with each other (see FIG. 11C), in turn appears, and the cavity loss for the TM mode or the threshold gain therefor is lessened. Thus, oscillation occurs in the TM mode. In this manner, the polarization mode switching can be performed by controlling the reverse voltage applied to the first index regulating layer 1019. The variation amount of the applied voltage during the switching from the TE-mode oscillation to the TM-mode oscillation is 4 V. Thus, the polarization mode switching or modulation can be performed by superposing a modulation voltage with the amplitude of 4 V on a bias voltage.

If one (e.g., TE mode) of the two polarization modes from the laser apparatus is selected by a polarizer 1050, the above-discussed laser apparatus can be used as a light source for intensity-modulation optical communication. In this case, since the amount of carriers injected into the active layer 1015 is kept unchanged, chirping is small, say less than 0.01 nm.

In this embodiment, wavelength tuning can be achieved by changing the amount of current injected into the active layer 1015. In this case, Bragg wavelengths in the respective regions are totally shifted, but the relative positional relationship is the same as that illustrated in FIGS. 11A–11C. Therefore, the polarization mode switching can also be performed by applying the modulation voltage to the first index regulating layer 1019.

In this embodiment, the tensile-stress strained multiple quantum well structure is used as the active layer 1015, but other types of active layers may be used in place thereof. For example, an InGaAsP single layer (composition wavelength: 1.55 μm), or a non-strained multiple quantum well structure, in which the grating pitch is set such that the Bragg wavelength for the TM mode is equal to the transition energy between the ground level of light holes and the ground level of electrons, may be used. Further, to increase the polarization mode dependency of the index regulating layers 1019 and 1020, strain may be introduced thereinto. Furthermore, an InGaAsP single layer (composition wavelength: 1.45 μm) or the like may be used as each of the index regulating layers 1019 and 1020. Further, a phase shift section is formed in the diffraction grating 1039 to improve the single modal property, but the phase shift section may be omitted.

Ninth Embodiment

A ninth embodiment of the present invention, which is an InP/InGaAsP series semiconductor laser apparatus, will be described with reference to FIGS. 12A and 12B and FIGS. 13A and 13B. In this embodiment, the oscillation polarization mode is turned over by injecting current (not a reverse voltage) into a refractive index regulating layer. The layer structure of the ninth embodiment is approximately the same as that of the eighth embodiment. The same layers are indicated by the same reference numerals. The ninth embodiment differs from the eighth embodiment in that a first index regulating layer 1119 is composed of an intrinsic InGaAsP single layer having a thickness of 0.15 μm.

Composition of the first index regulating layer 1119 is designed such that refractive indices for the TE mode are equal to each other between the first and second index regulating layers 1119 and 1020. Therefore, effective indices for the TE mode in the two regions are coincident with each other, and the Bragg wavelengths therefor are also equal to each other. On the other hand, for the TM mode, the refractive index of the first index regulating layer 1119 is larger than that of the second index regulating layer 1020 due to the polarization mode dependency of the refractive index of a super-lattice or quantum well structure. Thus, the effective refractive index for the TM mode in the first region is larger than that in the second region, and the Bragg wavelength for the TM mode in the first region is also larger than that in the second region.

Figure 13A:
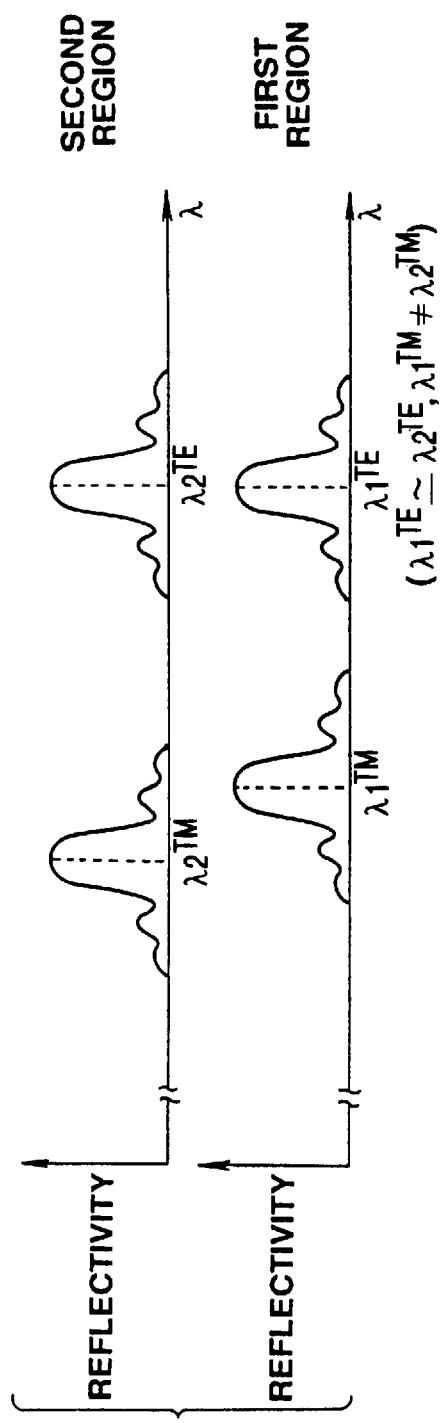
FIG. 13A is a graph illustrating a state of the ninth embodiment in which Bragg wavelengths for the TM mode in first and second regions are different from each other and Bragg wavelengths for the TE mode in first and second regions are equal to each other.

When appropriate bias current is injected into the active layer 1015 across the electrodes 1035 and 1037, relationships between the Bragg wavelength and the reflectivity in the respective regions are as illustrated in FIG. 13A. In this state, cavity loss for the TE mode or threshold gain therefor is smaller than the cavity loss for the TM mode or the threshold gain therefor. Thus, oscillation occurs in the TE mode.

Figure 13B:
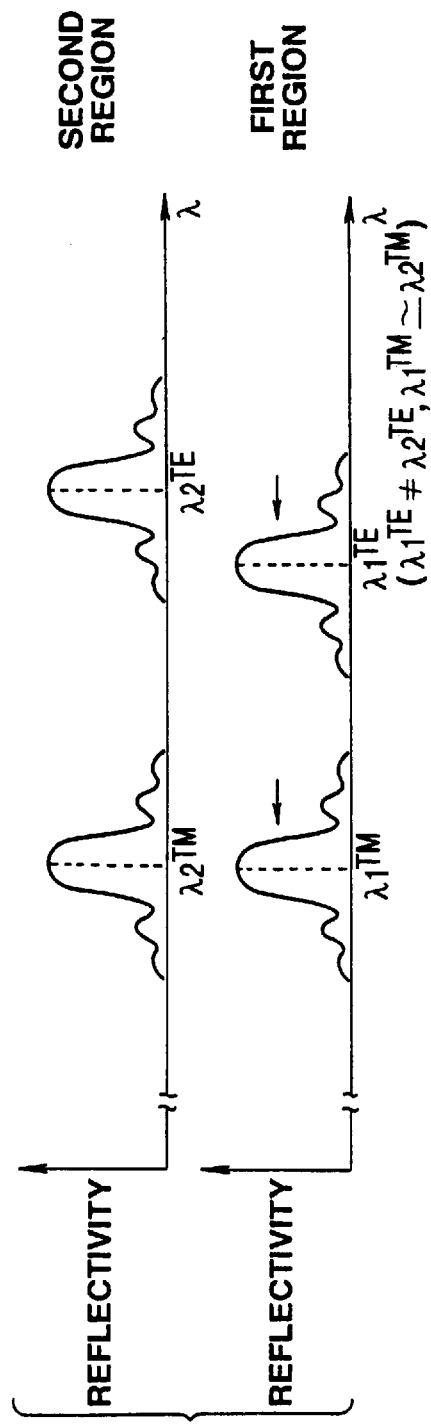
FIG. 13B is a graph illustrating a state of the ninth embodiment in which Bragg wavelengths for the TE mode in first and second regions are different from each other and Bragg wavelengths for the TM mode in first and second regions are equal to each other.

Then, when current is injected into the first index regulating layer 1119 across the electrodes 1033 and 1035, the refractive index is lowered due to increase in carriers. As a result, the Bragg wavelengths for the TM mode in the two regions become coincident with each other as illustrated in FIG. 13B. In this state, cavity loss for the TM mode or threshold gain therefor is smaller than cavity loss for the TE mode or threshold gain therefor. Thus, oscillation occurs in the TM mode. In this manner, the polarization mode switching can be performed by controlling the current injected into the first index regulating layer 1119.

In this embodiment, similar to the eighth embodiment, wavelength tuning can be achieved by changing the amount of current injected into the active layer 1015. In this case, Bragg wavelengths in the respective regions are totally shifted, but the relative positional relationship is the same as that illustrated in FIGS. 13A and 13B. Therefore, the polarization mode switching can also be performed by injecting the modulation current into the first index regulating layer 1119 in this case.

In this embodiment, composition of the first index regulating layer 1119 is designed such that the Bragg wavelengths for the TE mode in the respective regions are coincident with each other in a state in which no current is injected into the first index regulating layer 1119. For this purpose, an InGaAsP layer of an appropriate composition may be used and thicknesses of the waveguides and pitches of the diffraction gratings may be changed between the respective regions, so that the relationship as illustrated in FIG. 13A can be attained. Further, there is no need to accurately coincide the Bragg wavelengths for the TE mode with each other, and a little shift therebetween is allowable if the shift can be compensated for by the current injection. In addition, a multiple quantum well structure may be used in the first index regulating layer 1119 to increase a change in the effective refractive index.

Tenth Embodiment

Figure 14A:
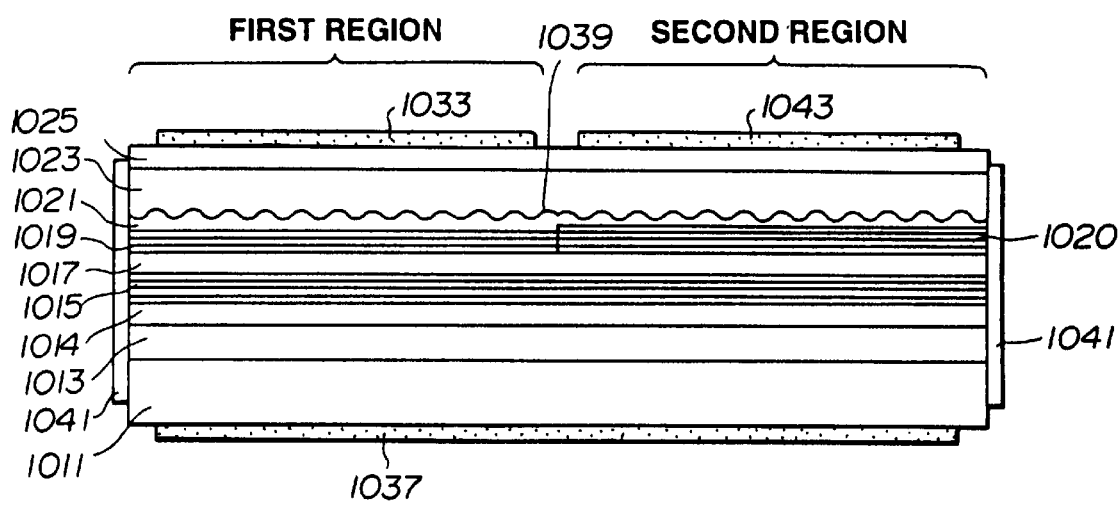
FIG. 14A is a cross-sectional view illustrating a tenth embodiment of an optical semiconductor apparatus having first and second refractive index regulating layers and electrodes for controlling the first and second refractive index regulating layers according to the present invention.
Figure 14B:
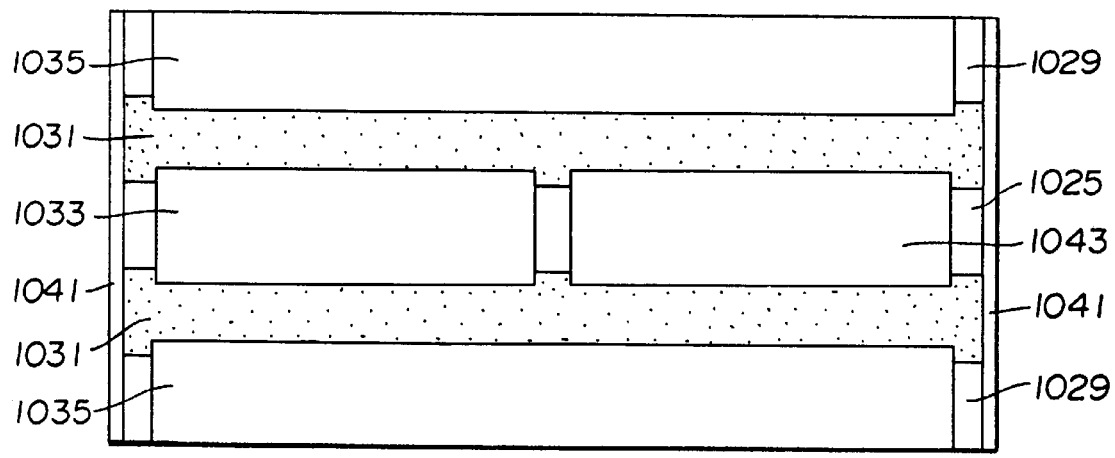
FIG. 14B is a plan view illustrating the tenth embodiment.

A tenth embodiment of the present invention, which is an InP/InGaAsP series semiconductor laser apparatus, will be described with reference to FIGS. 14A and 14B. The layer structure of the tenth embodiment is approximately the same as that of the eighth embodiment. The same layers are indicated by the same reference numerals. The tenth embodiment differs from the eighth embodiment in that an electrode 1043 is added to enable current injection into or voltage application to the second index regulating layer 1020 as well.

In this embodiment, a voltage can be applied to the first index regulating layer 1019 and current can be injected into the second index regulating layer 1020, or both can be conducted, so that the oscillation polarization mode can be switched.

Further, in this embodiment, even if the relation between the gain peak wavelength of the active layer 1015 and the Bragg wavelength is deviated from a designed one, the deviation can be compensated for by the current injection into or the voltage application to the two index regulating layers 1019 and 1020. Thus, fabrication torelance is improved. Moreover, the Bragg wavelengths can be entirely shifted by the current injection into or the voltage application to the two index regulating layers 1019 and 1020 while the positional relationship between the Bragg wavelengths as illustrated in FIGS. 11A–11C is maintained. Hence, wavelength tuning can be performed while a state, in which the oscillation polarization mode switching can be conducted, is maintained.

Eleventh Embodiment

Figure 15A:
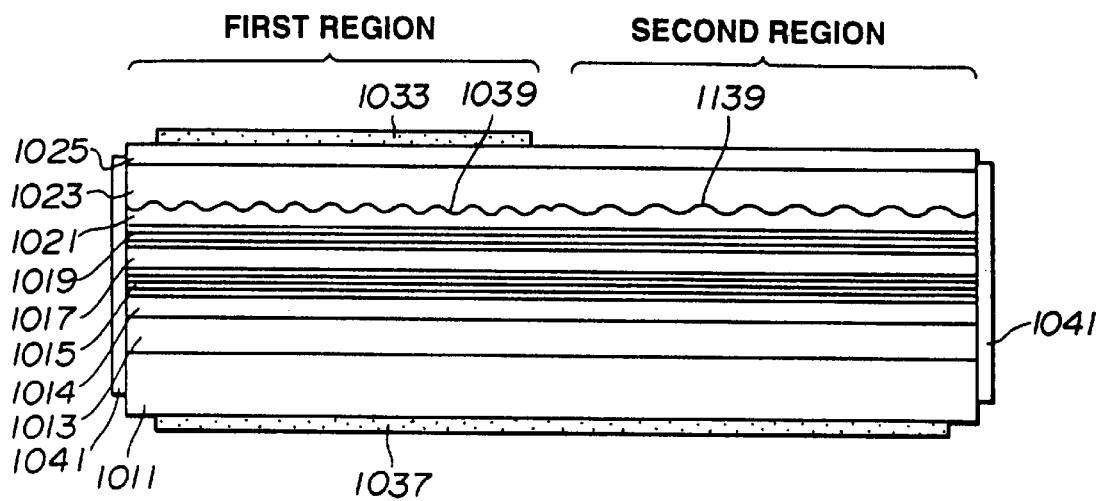
FIG. 15A is a cross-sectional view illustrating an eleventh embodiment of an optical semiconductor apparatus having a common refractive index regulating layer and diffraction gratings with different pitches according to the present invention.
Figure 15B:
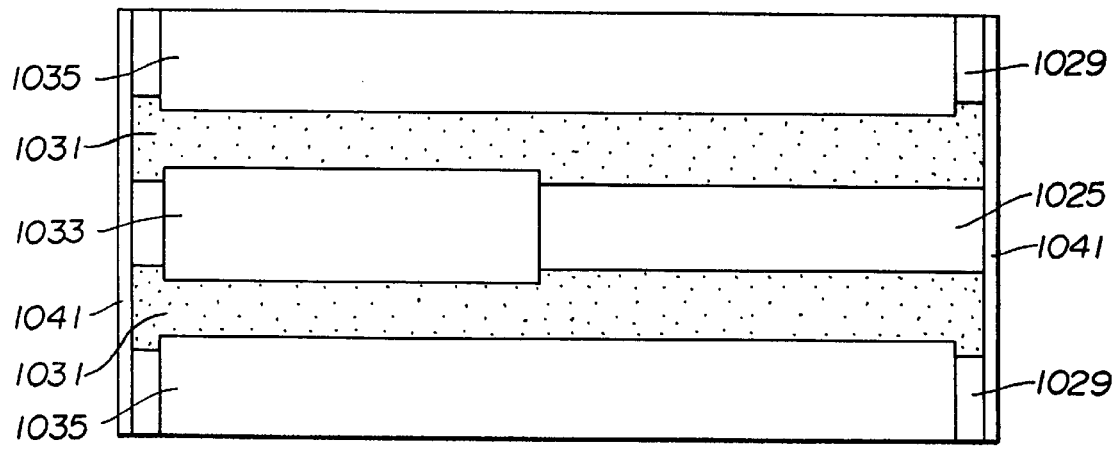
FIG. 15B is a plan view illustrating the eleventh embodiment.

An eleventh embodiment of the present invention will be described with reference to FIGS. 15A and 15B. The layer structure in a first region of the eleventh embodiment is the same as that of the eighth embodiment. The same layers are indicated by the same reference numerals. The eleventh embodiment differs from the eighth embodiment in that layer structures in the first and second regions have the same width and the pitch (241.5 nm) of a grating 1139 formed in the second embodiment is a little larger than the pitch (240 nm) of a grating 1039 formed in the first region.

In this embodiment, effective refractive indices of the first and second regions are equal to each other since the layer structures are the same therebetween, but the pitches of the gratings 1039 and 1139 therein are different from each other. Therefore, the Bragg wavelengths of the second region are slightly larger than those of the first region. As a result, the positional relationship among the Bragg wavelengths (or reflectivities) is as illustrated in FIGS. 11A–11C. Consequently, the operation of the eleventh embodiment is substantially the same as the eighth embodiment.

In this embodiment, the layer structures in the two regions are identical with each other, in contrast to the eighth embodiment. Hence, no special etching and selective growth are needed, and the growth process can be simplified.

Twelfth Embodiment

Figure 16A:
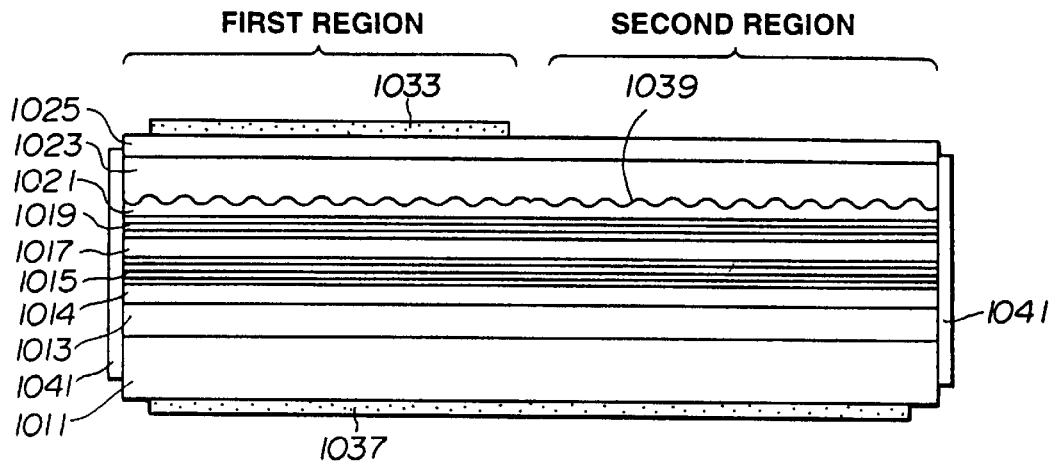
FIG. 16A is a cross-sectional view illustrating a twelfth embodiment of an optical semiconductor apparatus having a common refractive index regulating layer and waveguides with different widths according to the present invention.
Figure 16B:
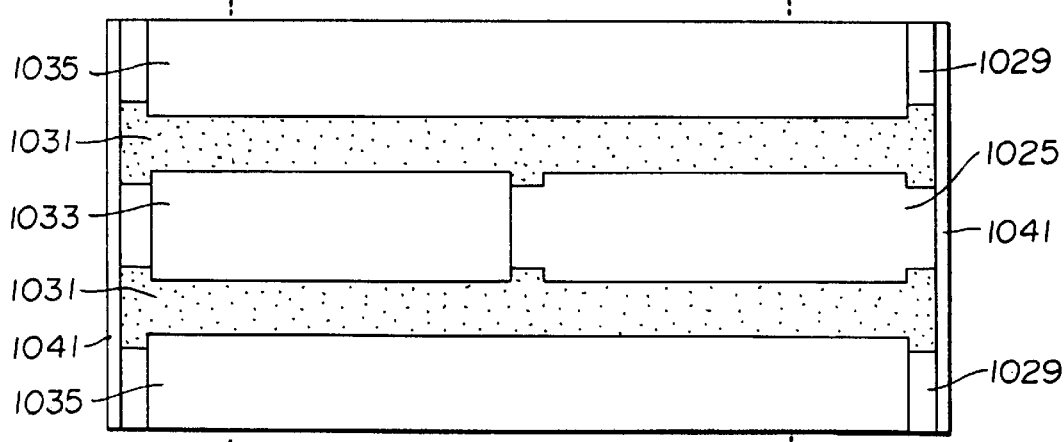
FIG. 16B is a plan view illustrating the twelfth embodiment.
Figures 16C, 16D:
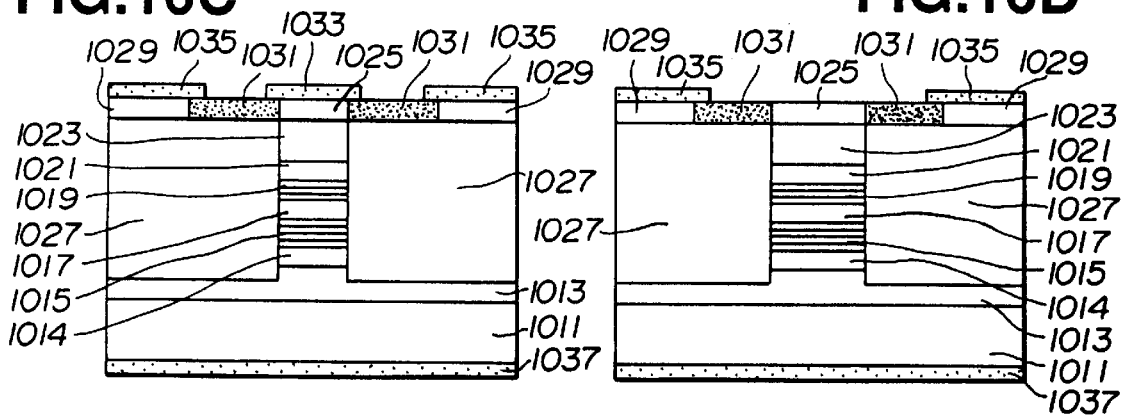
FIG. 16C is a cross-sectional view of FIG. 16B taken along line a–a' in FIG. 16B.
FIG. 16D is a cross-sectional view of FIG. 16B taken along line b–b' in FIG. 16B.

A twelfth embodiment of the present invention will be described with reference to FIGS. 16A–16D. The layer structure in a first region of the twelfth embodiment is the same as that of the eighth embodiment. The same layers are indicated by the same reference numerals. The twelfth embodiment differs from the eighth embodiment in that layer structures in first and second regions have the same width, the pitch of the gratings is the same, and the waveguide width (3.0 $\mu$m) of the second region is a little wider than that (2.5 $\mu$m) of the first region, as illustrated in FIG. 16B. FIGS. 16C and 16D are respectively a–a' and b–b' cross-sectional views of FIG. 16B.

In this embodiment, the effective refractive index of the second region is slightly larger than that of the first region since the waveguide widths are different between the first and second regions, as described above. The positional relationship among the Bragg wavelengths (or reflectivities) is the same as illustrated in FIGS. 11A–11C. Consequently, the operation of the twelfth embodiment is substantially the same as that of the eighth embodiment.

In this embodiment, the layer structures in the two regions are identical with each other, in contrast to the eighth embodiment, and hence no special etching and selective growth are needed. Thus, the growth process can be simplified. Further, compared with the eleventh embodiment, the diffraction grating 1039 can be readily fabricated since the pitch of the grating 1039 is constant.

In each of the eleventh and twelfth embodiments, the structure may be built such that current injection into or voltage application to both of the first and second index regulating layers 1019 can be performed, similar to the tenth embodiment.

Thirteenth Embodiment

Figure 17A:
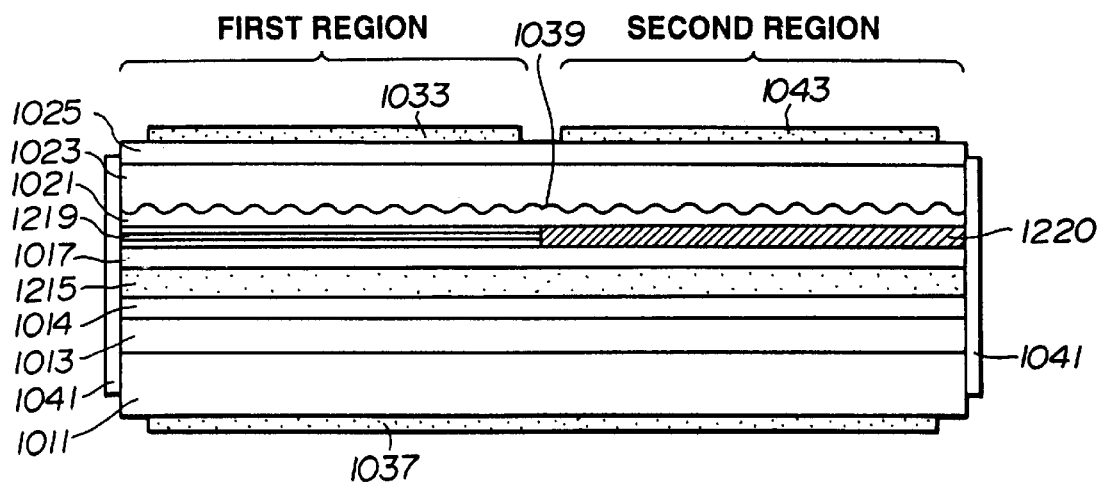
FIG. 17A is a cross-sectional view illustrating a thirteenth embodiment of an optical semiconductor apparatus having different refractive index regulating layers, an active layer and electrodes for controlling the different refractive index regulating layers according to the present invention.
Figure 17B:
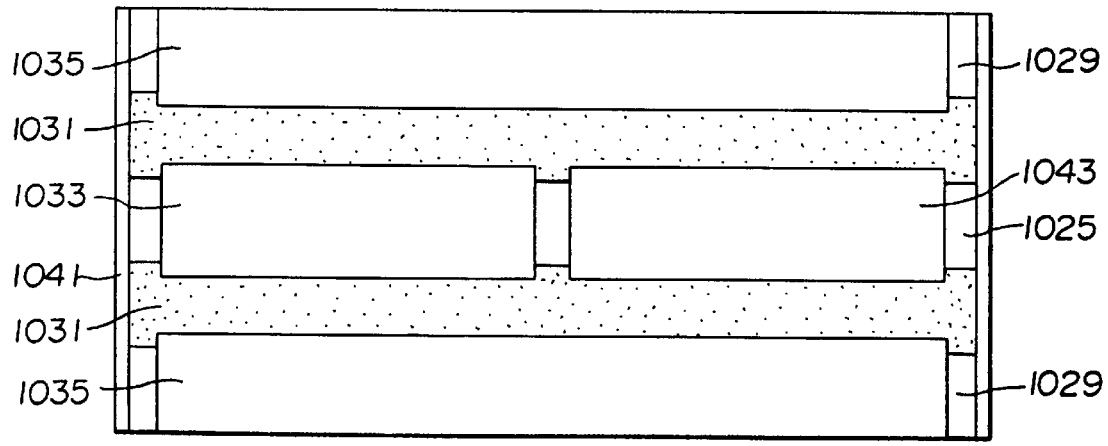
FIG. 17B is a plan view illustrating the thirteenth embodiment.

A thirteenth embodiment of the present invention will be described with reference to FIGS. 17A and 17B. In this embodiment, the layer structure of a first region is approximately the same as that of the eighth embodiment. The same layers are indicated by the same reference numerals. The thirteenth embodiment differs from the eighth embodiment in that current injection into or voltage application to a second index regulating layer 1220 can be performed, similar to the tenth embodiment, an active layer 1215 is constructed by an intrinsic InGaAsP single layer having a composition wavelength of 1.55 $\mu$m and the structures of index regulating layers 1219 and 1220 are different from each other. Gains for the TE mode and the TM mode can be made close to each other by the bulk-type active layer 1215, and this contributes to an efficient polarization mode switching.

The first index regulating layer 1219 has a quantum well structure which consists of ten pairs of intrinsic $In_{0.53}Ga_{0.47}As$ well layers (thickness: 4 nm) and intrinsic InGaAsP barrier layers (composition wavelength: 1.15 $\mu$m and thickness: 10 nm), and the second index regulating layer 1220 is composed of semiconductor material which is made by mixing or disordering the material of the first index regulating layer 1219. The mixing reduces double refraction of the super-lattice layer, and the refractive index for TE mode is decreased while the refractive index for the TM mode is increased. The effective refractive indices therefor are also changed similarly. Thus, the positional relationship among the Bragg wavelengths and the reflectivities is as illustrated in FIG. 18A.

The operation of this embodiment is as follows.

Initially, when appropriate bias current is injected into the active layer 1215 and a voltage is applied to the second index regulating layer 1220, the Bragg wavelengths for the TE mode become approximately equal to each other between the first and second regions (see FIG. 18B). At this time, cavity loss for the TE mode or its threshold gain is lowered, and oscillation occurs in the TE mode.

Then, when a voltage is applied to the first index regulating layer 1219, the Bragg wavelengths for the TM mode in the two regions become coincident with each other as illustrated in FIG. 18C. In this state, cavity loss for the TM mode or its threshold gain therefor is lowered. Thus, oscillation occurs in the TM mode. In this manner, the oscillation polarization mode switching can be performed by controlling the voltage applied to the first index regulating layer 1219.

In the eighth embodiment, etching of a predetermined area and selective growth are needed since the structures of the first and second index regulating layers are different from each other. In this embodiment, however, the growth process can be simplified because the index regulating layers 1219 and 1220 can be formed by mixing a predetermined area by hydrogen-ion bombardment, heat treatment, diffusion of impurities or the like after the super-lattice layer is laid down over the entire region.

A quantum well structure may be adopted in the active layer 1215 of this embodiment. In this case, however, the depth control of mixing should be precisely conducted such that adverse influences will not be imparted to the active layer 1215. Further, in this embodiment, if the Bragg wavelengths for the TE mode are made approximately equal to each other between the first and second regions by making the grating pitches or the waveguide widths thereof different from each other, the electrode 1043 for the second index regulating layer 1220 may be omitted.

Fourteenth Embodiment

Figure 19:
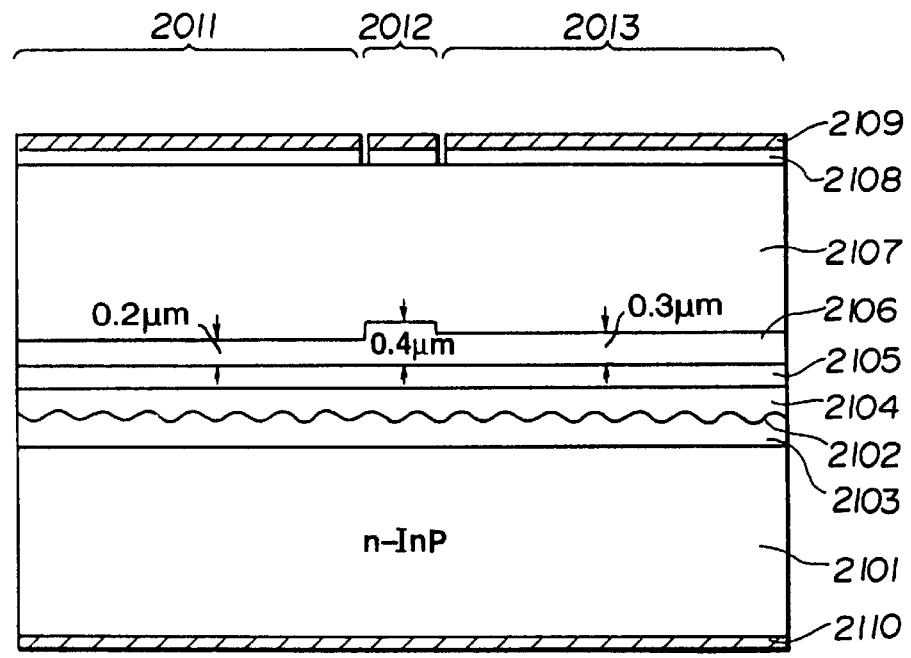
FIG. 19 is a cross-sectional view illustrating a fourteenth embodiment of an optical semiconductor apparatus having a phase shift region according to the present invention.
Figure 20:
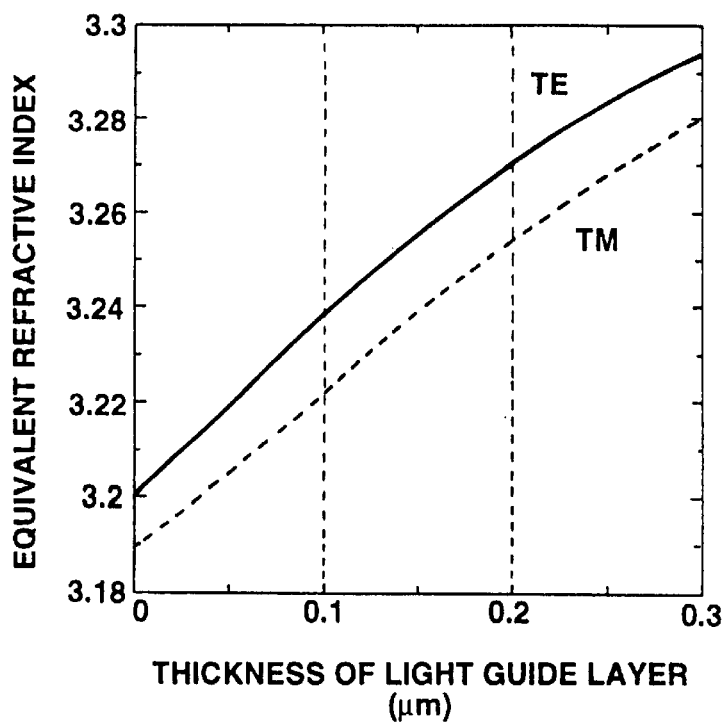
FIG. 20 is a graph illustrating a relationship between a difference in light guide layer thicknesses and equivalent refractive indices for the TE mode and the TM mode.

A fourteenth embodiment of the present invention, which is an InP/InGaAsP series semiconductor laser apparatus, will be described with reference to FIGS. 19 and 20. The device has the following structure. In FIG, 19 which is a cross-sectional view taken along a cavity direction, reference numerals 2011 and 2013 respectively designate distributed feedback (DFB) portions having waveguides of different layer thicknesses. The former is named a front region and the latter is named a rear region. Reference numeral 2012 is a phase shift region in which the layer thickness of the waveguide is larger than the layer thicknesses of the waveguides in the front and rear regions 2011 and 2013.

The layer structure is as follows. On an n-type InP substrate 2101, an n-type InP buffer layer 2103 (thickness: 0.5 µm), on which a diffraction grating 2102 having a pitch of 239.4 nm is formed, an n-type InGaAsP lower light guide layer 2104 having a thickness of 0.15 µm and a bandgap wavelength of 1.17 µm, an active layer 2105 of a strained quantum well structure, and a p-type InGaAsP upper light guide layer 2106 having a thickness of 0.4 µm and a bandgap wavelength of 1.17 µm are formed. Then, etching is conducted by photolithography to reduce the thickness of the light guide layer 2106 in the front region 2011 by about 0.2 µm and the thickness of the light guide layer 2106 in the rear region 2013 by about 0.1 µm. After that, a p-type InP clad layer 2107 having a thickness of 1.8 µm, and a p-type InGaAsP contact layer 2108 are laid down on the wafer.

The active layer 2105 having the strained quantum well structure consists of five pairs of intrinsic (i-) $In_{0.53}Ga_{0.47}As$ well layers (thickness: 6 nm) and $i-In_{0.28}Ga_{0.72}As$ barrier layers (thickness: 10 nm). Lengths of the respective regions 2011, 2012 and 2013 are respectively 250 µm, 20 µm and 250 µm. In this embodiment, the length is symmetrical about the phase shift region 2012, but the length can be asymmetrical.

Then, the waveguide width in a lateral or transverse direction is made 3 µm over the entire region to form a ridge, and the ridge is surrounded by $SiN_x$ layers (not shown). Two electrode-separation portions are formed by removing the contact layer 2108. Then, an Au/Zn/Au layer 2109, which is a p-side electrode having three portions, and an AuGe/Au layer 2110, which is a bottom-side electrode, are deposited, and those electrodes 2109 and 2110 are alloyed. Layers of $SiN_x$ are provided as an antireflection coating on both opposite end facets (not shown).

The operation of this embodiment will be described with reference to FIG. 20. Bragg wavelength $\lambda_b$ is related to equivalent or effective refractive index $n_{eql}$ and a grating pitch Λ as follows:

$\lambda_b = 2n_{eql}\Lambda$.

The principle is the same as the first embodiment. In this embodiment, the light guide layer's thickness of the front region 2011 differs from that of the rear region 2013, so that the equivalent refractive index varies as illustrated in FIG. 20 between the front region 2011 and the rear region 2013. The difference $\lambda_b^{TE}-\lambda_b^{TM}$ between the Bragg wavelengths for the respective modes is 7.7 nm in the front region 2011 wherein the width of the light guide layer 2106 is 0.2 µm, while the difference $\lambda_b^{TE}-\lambda_b^{TM}$ between the Bragg wavelengths for the respective modes is 6.7 nm in the rear region 2013 wherein the width of the light guide layer 2106 is 0.3 µm. When the Bragg wavelengths for one of the polarization modes are coincident with each other between the front region 2011 and the rear region 2013, the Bragg wavelengths for the other of the polarization modes are different from each other between the front region 2011 and the rear region 2013. In a state in which the Bragg wavelengths for one of the polarization modes are coincident with each other between the front region 2011 and the rear region 2013, if the oscillation condition at its Bragg wavelength is satisfied in the phase shift region 2012, oscillation occurs in that polarization mode (the TE mode or the TM mode).

The oscillation wavelength is one that satisfies the phase condition near the Bragg wavelength for the TE mode or the TM mode. In this embodiment, when the Bragg wavelengths for the TM mode are made coincident with each other at 1550.0 nm, the Bragg wavelength for the TE mode is 1557.7 nm in the front region 2011 and 1556.7 nm in the rear region 2013. As discussed above, there is a difference of 1 nm. In the phase shift region 2012, light in the TM mode receives a phase shift of (2n−1)λ, and oscillation occurs in the TM mode. From this state, when the threshold gain near the Bragg wavelength for the TE mode is lowered by changing currents injected into the rear region 2013 and the phase shift region 2012, oscillation in turn occurs in the TE mode.

In this embodiment, no special fabrication techniques, such as selective growth, are used. Further, the Bragg wavelengths for the TM mode in the respective regions are approximately equal to each other in a state in which substantially uniform current carriers are injected. From this state, the Bragg wavelengths for the TE mode become equal to each other by slightly unevenly injecting current carriers. In this embodiment, a large difference $\lambda_b^{TE}-\lambda_b^{TM}$ can be obtained relatively readily since the layer thickness is changed between the two regions 2011 and 2013. Therefore, the polarization mode switching can be accurately attained. In this embodiment, though the thickness in the phase shift region 2012 is made maximum (0.4 µm), this thickness can be minimum, say about 0.1 λm, to achieve the same effect.

Fifteenth Embodiment

Figure 21A:
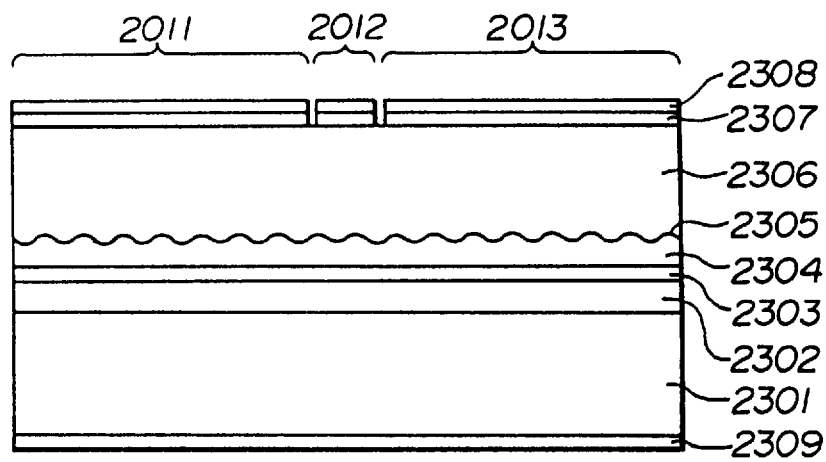
FIG. 21A is a cross-sectional view illustrating a fifteenth embodiment of an optical semiconductor apparatus having a phase shift region according to the present invention.

A fifteenth embodiment of the present invention, which is an InP/InGaAsP series semiconductor laser apparatus, will be described with reference to FIGS. 21A and 21B and FIG. 22. The device has three DFB regions 2011, 2012 and 2013 whose waveguide widths are different from each other.

The layer structure is as follows. On an n-type InP substrate 2301, an n-type InGaAsP lower light guide layer 2302 having a thickness of 0.15 µm and a bandgap wavelength of 1.17 µm, an intrinsic InGaAsP active layer 2303 having a thickness of 0.08 µm and a bandgap wavelength of 1.51 µm, and a p-type InGaAsP upper light guide layer 2304 having a thickness of 0.1 µm and a bandgap wavelength of 1.17 µm, on which a diffraction grating 2305 with a pitch of 240 nm is formed, are laid down. After that, a p-type InP clad layer 2306, and a p-type InGaAsP contact layer 2307 are laid down on the wafer.

Figure 21B:
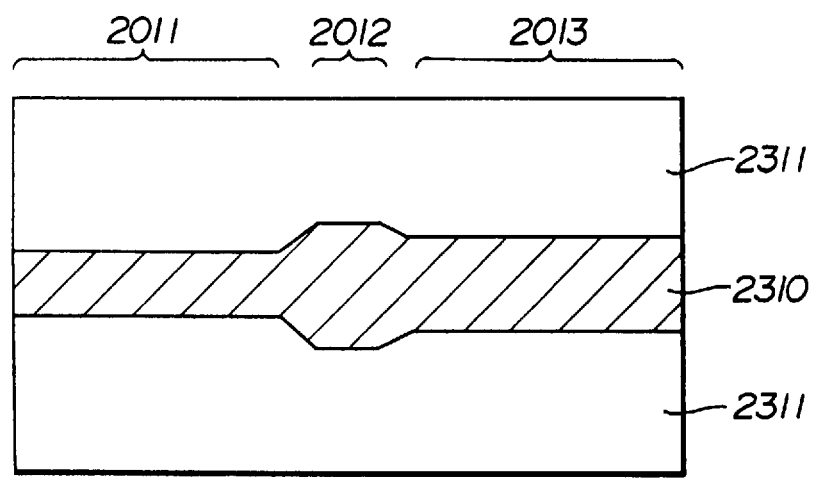
FIG. 21B is a plan view illustrating the fifteenth embodiment.
Figure 22:
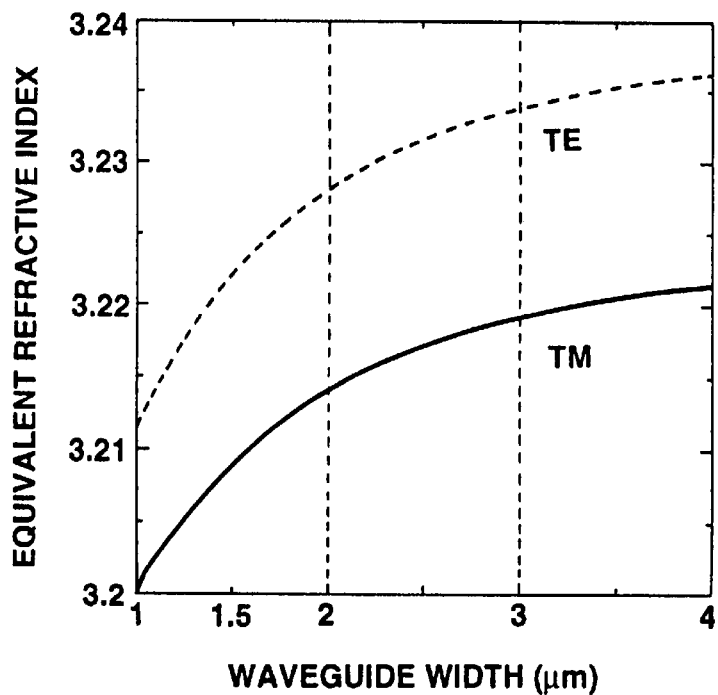
FIG. 22 is a graph illustrating a relationship between a difference in waveguide widths and equivalent refractive indices for the TE mode and the TM mode.

Then, as illustrated in FIG. 21B, a ridge 2310 is formed to make the waveguide widths in the front region 2011, the phase shift region 2012 and the rear region 2013 equal to 1.5 µm, 3 µm and 2 µm, respectively. Both sides of the ridge 2310 are buried with high-resistance InP layers 2311. In this embodiment, the waveguide width in the phase shift region 2012 is maximized, but this may be minimum. Lengths of the respective regions 2011, 2012 and 2013 are 300 µm, 25 µm and 300 µm, respectively. Portions of the two regions 2011 and 2013 adjacent the phase shift region 2012 are tapered or gradually changed as illustrated in FIG. 21B to prevent loss of oscillation light thereat.

Then, two electrode-separation portions are formed by removing the contact layer 2307. Then, an Au/Cr layer 2308, which is a p-side electrode having three portions, and an AuGe/Au layer 2309, which is a bottom-side electrode, are deposited, and those electrodes are alloyed. Layers of $SiN_x$ are provided as an antireflection coating on both opposite end facets (not shown), similar to the fourteenth embodiment.

In this embodiment, though the waveguide layer thicknesses in the respective regions 2011, 2012 and 2013 are not changed, their widths are made different from each other. Thus, differences between equivalent refractive indices for the TE mode and the TM mode are made different among the three DFB regions 2011, 2012 and 2013. As can be understood from FIG. 22, the Bragg wavelength for the TE mode in the front region 2011, whose waveguide width is 1.5 μm, is 1546.6 nm, and that for the TM mode is 1540.2 nm. The Bragg wavelength for the TE mode in the rear region 2013, whose waveguide width is 2 μm, is 1549.5 nm, and that for the TM mode is 1542.7 nm. The Bragg wavelength differences in the regions 2011 and 2013 are respectively 6.4 nm and 6.8 nm, as seen from the above values. In this structure, the oscillation polarization mode switching between the TE mode and the TM mode can be attained by controlling currents injected into the respective electrode portions.

In the fabrication process of this embodiment, photoresist is exposed and developed, using a photomask having portions corresponding to the waveguides of different widths. As for the rest, an ordinary fabrication method for a DFB laser can be used to obtain the structure with an uneven equivalent index distribution as discussed above.

Sixteenth Embodiment

Figure 23:
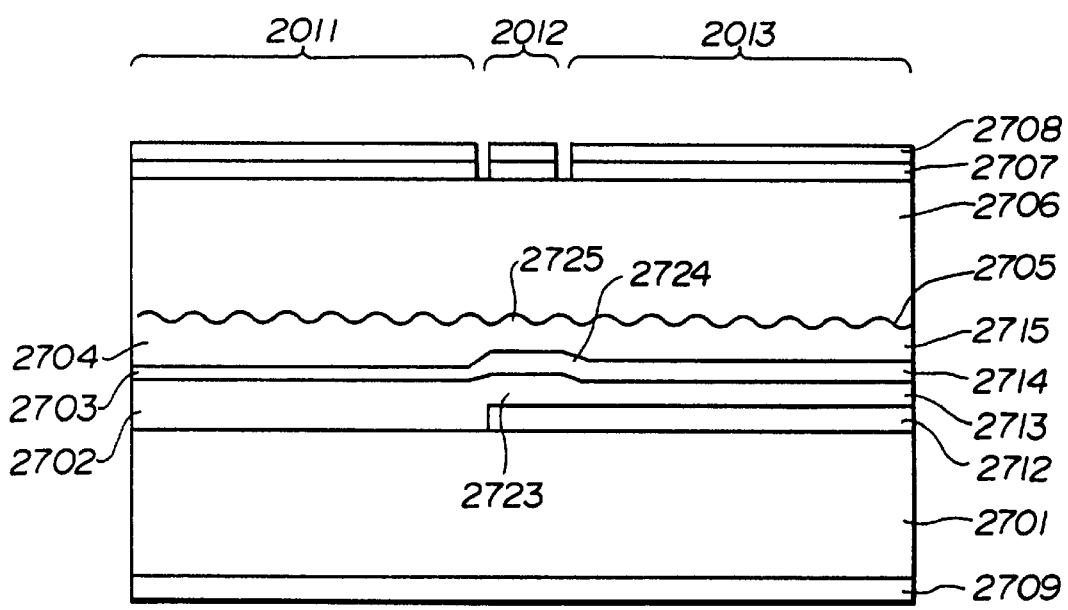
FIG. 23 is a cross-sectional view illustrating a sixteenth embodiment of an optical semiconductor apparatus having a phase shift region with a different layer structure according to the present invention.

A sixteenth embodiment of the present invention, which is an InP/InGaAsP series semiconductor laser apparatus, will be described with reference to FIG. 23. The device has three DFB regions 2011, 2012 and 2013 in which thicknesses of light-confining layers are different from each other.

The layer structure is as follows. As is shown in FIG. 23, in the front region 2011, on an n-type InP substrate 2701, an n-type $In_{0.79}Ga_{0.21}As_{0.45}P_{0.55}$ lower light guide layer 2702 having a thickness of 0.2 μm, an intrinsic $In_{0.59}Ga_{0.41}As_{0.87}P_{0.13}$ active layer 2703 having a thickness of 0.05 μm, and a p-type $In_{0.79}Ga_{0.21}As_{0.45}P_{0.55}$ upper light guide layer 2704 having a thickness of 0.2 μm are formed. In the rear region 2013, on the n-type InP substrate 2701, an n-type InP buffer layer 2712 having a thickness of 0.1 μm (for example, the buffer 2712 is laid down on the substrate 2701, using a mask to cover the front region 2011), an n-type $In_{0.79}Ga_{0.21}As_{0.45}P_{0.55}$ lower light guide layer 2713 having a thickness of 0.09 μm, an intrinsic $In_{0.59}Ga_{0.41}As_{0.87}P_{0.13}$ active layer 2714 having a thickness of 0.07 μm, and a p-type $In_{0.79}Ga_{0.21}As_{0.45}P_{0.55}$ upper light guide layer 2715 having a thickness of 0.18 μm are formed. In the phase shift region 2012, on the n-type InP substrate 2701, the n-type InP buffer layer 2712 having a thickness of 0.1 μm, an n-type $In_{0.79}Ga_{0.21}As_{0.45}P_{0.55}$ lower light guide layer 2723 having a thickness of 0.17 μm, an intrinsic $In_{0.59}Ga_{0.41}As_{0.87}P_{0.13}$ active layer 2724 having a thickness of 0.1 μm, and a p-type $In_{0.79}Ga_{0.21}As_{0.45}P_{0.55}$ upper light guide layer 2725 having a thickness of 0.08 μm are formed.

Then, a diffraction grating 2705 of a pitch of 237 nm is formed on the upper light guide layers 2704, 2715 and 2725 over the entire regions 2011, 2012 and 2013. After that, a p-type InP clad layer 2706, and a p-type $In_{0.59}Ga_{0.41}As_{0.9}P_{0.1}$ contact layer 2707 are laid down on the wafer.

Then, a ridge is formed to make widths of the active layers 2703 and 2714 equal to 3 μm both in the DFB regions 2011 and 2013. Both sides of the ridge are buried with $SiN_x$ layers (not shown). Electrodes 2708 and 2709 and antireflection coatings (not shown) are formed in the same manner as the fourteenth embodiment.

In this embodiment, the fabrication method is a little complicated, but the degree of design freedom increases. Therefore, in this embodiment, the following design is possible. Namely, the Bragg wavelengths for the TE mode are relatively close to each other between the front and rear regions 2011 and 2013, the Bragg wavelengths for the TE mode are made coincident with each other under a condition under which approximately uniform carrier density is established, and the Bragg wavelengths for the TM mode are made coincident with each other while its gain remains as unchanged as possible, by changing the uniform carrier density to a slightly uneven injection state. The operation and the driving method of this embodiment are the same as those of the fourteenth embodiment. Further, to increase or compensate for the difference between Bragg wavelength differences in the two regions 2011 and 2013, the waveguide widths as well as the layer thicknesses may be changed between the two regions 2011 and 2013.

By the way, in the above embodiments, formation of the ridge and the burying method with high-resistance layers are adopted, but current restraint and light confinement using reverse bias at the p-n junction may be used, for example. Furthermore, in connection with the light confinement structure in the waveguide plane, buried-hetero (BH) structure is used in the above embodiments, but any structure that can achieve light confinement in a lateral direction may be used.

Seventeenth Embodiment

Figure 24:
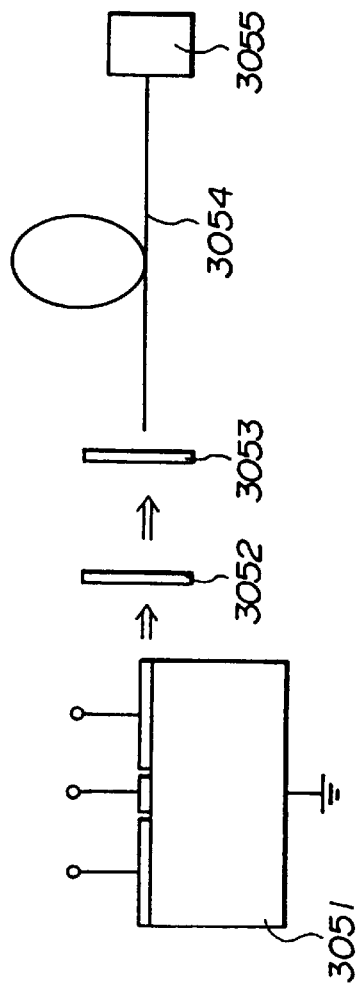
FIG. 24 is a block diagram illustrating an optical communication system using an optical semiconductor apparatus of the present invention.

FIG. 24 illustrates an optical transmission system in which an intensity (or amplitude) modulated signal is transmitted, using an oscillation polarization mode selective laser apparatus of the present invention, and the signal is received at a receiver side. A light output from a laser apparatus 3051 is transmitted through a polarizer 3052 and only a component in the TE mode or the TM mode is selected. Thus, the intensity-modulated signal can be obtained with a high extinction ratio. In the laser apparatus 3051, the oscillation polarization mode is changed between the TE mode and the TM mode, but fluctuation in light output intensity of the laser apparatus 3051 scarcely appears. Hence, chirping due to carrier fluctuation in an active layer of the laser apparatus 3051 is extremely small. Light in the TE mode or the TM mode selected by the polarizer 3052 is coupled to an optical fiber 3054 through an isolator 3053 and transmitted in the optical fiber 3054. The transmitted light is detected by a photodetector 3055. The extinction ratio between light components in the TE mode and the TM mode, say more than 20 dB, can be obtained. Thus, amplitude shift keying (ASK) transmission with such extinction ratio is possible.

The chirping of the laser apparatus of the present invention during polarization mode modulation is quite small, and the chirping of less than 0.02 nm can be observed. The modulation range of the polarization mode modulation can be more than 1 GHz.

Eighteenth Embodiment

Figure 25:
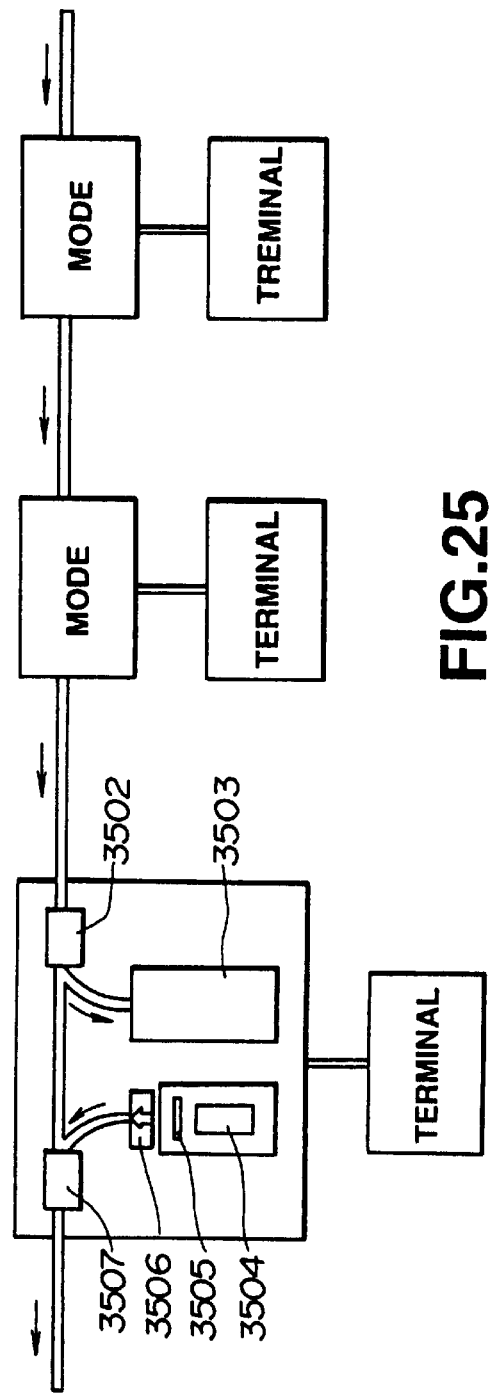
FIG. 25 is a block diagram illustrating a bus-type optical communication system using an optical semiconductor apparatus of the present invention.

An eighteenth embodiment will now be described with reference to FIG. 25. The eighteenth embodiment is directed to an optical local area network (LAN) system or a frequency or wavelength division multiplexing optical LAN system using a light source including an oscillation polarization mode selective laser apparatus of the present invention. FIG. 25 also illustrates an opto-electric converting unit (node), which is connected to a terminal of the optical LAN system shown in FIG. 25.

In the bus-type network shown in FIG. 25, multiple terminals are respectively connected to an optical fiber through nodes.

In FIG. 25, a light signal is taken into the node through the optical fiber, and a portion of the signal is input into an optical receiver 3503 by a branching device 3502. The optical receiver 3053 includes a tunable optical filter (e.g., a fiber Fabry-Perot filter, a Max-Zehnder filter or an interference film filter) and a photodetector, and only signal light at a desired wavelength is taken out from the incident signal light, and the signal is detected.

On the other hand, when a light signal is transmitted from the node, signal light from an oscillation polarization mode selective semiconductor laser apparatus 3504 of the present invention is input into the optical fiber at a combining portion 3507 through a polarizer 3505 and an isolator 3506. The laser apparatus 3504 is driven by a method described in the above embodiments, and a polarization-modulated light wave emitted from the laser apparatus 3504 is converted to an intensity-modulated light output by the polarizer 3505.

A plurality of tunable optical filters and semiconductor laser apparatuses may be arranged in a node to widen the wavelength tunable range. Further, two nodes may be connected to each terminal and two optical fibers may be provided to accomplish bi-directional transmission of a DQDB system.

In such an optical network system, when the driving method and the optical transmission system of the present invention are used, a high-density (say, more than 100 channels if the wavelength tunable width is 2 nm, since the wavelength fluctuation during modulation is less than 0.01 nm) wavelength or optical frequency division multiplexing network can be constructed.

Nineteenth Embodiment

As a network, a loop type, which is constructed by connecting the ends in FIG. 25, a star type, or a compound configuration thereof may be used. The nineteenth embodiment is directed to a loop type optical network system.

Figure 26A:
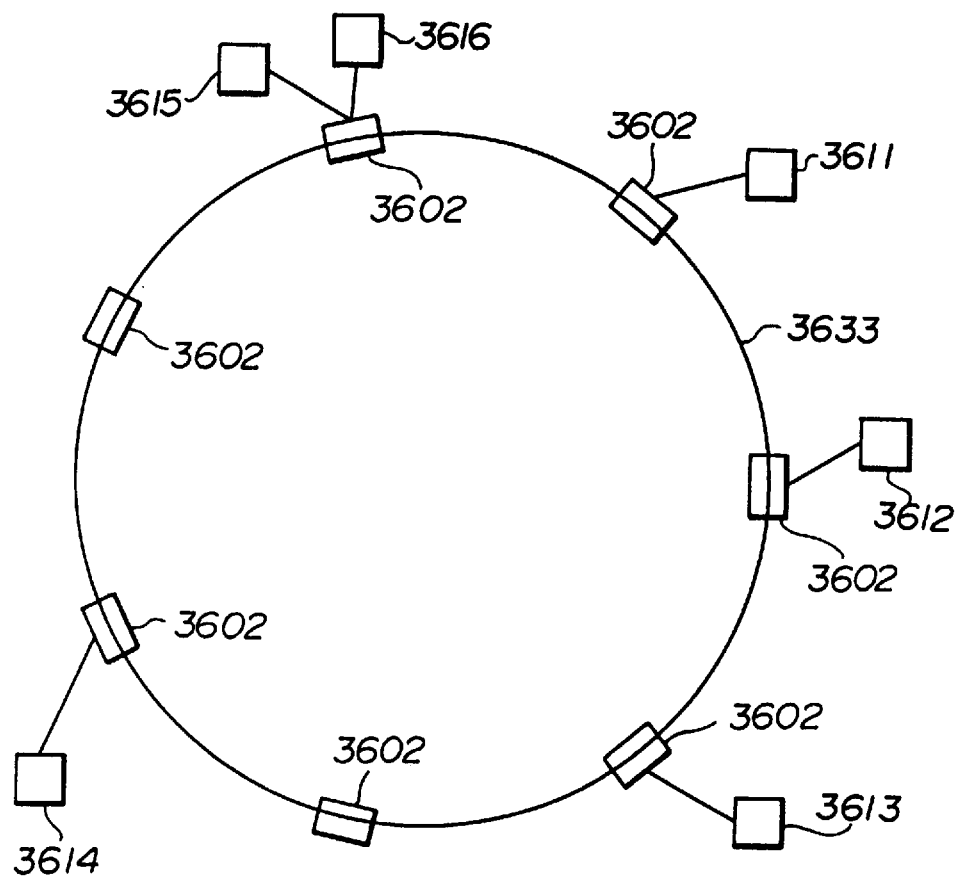
FIG. 26A is a block diagram illustrating a loop-type optical communication system using an optical semiconductor apparatus of the present invention.
Figure 26B:
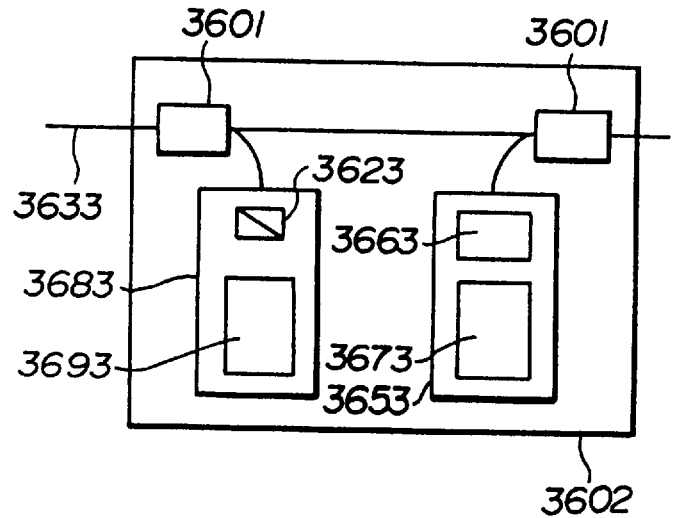
FIG. 26B is a block diagram illustrating a node used in the loop-type optical communication system of the present invention.

In FIGS. 26A and 26B, reference numeral 3693 is a semiconductor laser apparatus of the present invention which is polarization-modulated while wavelength and extinction ratio are stably controlled. In the laser apparatus 3693, the wavelength interval is about 10 GHz (about 0.08 nm) and the wavelength can be changed in a range of 2 nm. In the polarization mode modulation, the chirping or dynamic wavelength fluctuation is very small, say 2 GHz (about 0.016 nm), so that no crosstalk between adjacent channels occurs even when wavelength division multiplexing is performed with an interval of 10 Ghz. Therefore, the wavelength division multiplexing with more than 100 channels (or 2/0.016 channels) is possible, as is discussed in the eighteenth embodiment.

A light transmitter 3683 shown in FIG. 26B includes the semiconductor laser apparatus 3693 and a polarization beam splitter (PBS) 3623. An optical node 3602 is composed of the light transmitter 3683 and a light receiver 3653.

When a light signal is transmitted from the node, signal light from the mode selective semiconductor laser apparatus 3693 of the present invention is input into an optical fiber 3633 at a combining portion 3601 through the PBS 3623. The light signal is taken into the node through the optical fiber 3633, and a portion of the signal is input into the optical receiver 3653 by a branching device 3601. The optical receiver 3653 includes a tunable optical filter 3663 (e.g., a demultilexer with a grating) and a photodetector 3673, and only signal light at a desired wavelength is taken out from the incident signal light, and the signal is detected. In this embodiment, the optical filter 3663 has the structure of a DFB laser which is stimulated by a bias current less than its threshold. By changing the current ratio between two electrodes of the optical filter 3663, the transmission wavelength can be changed by 2 nm while the transmission gain of 20 dB is maintained. The 10 dB-down transmission width of this filter 3663 is 0.03 nm, and this value is enough to perform the wavelength division multiplexing with an interval of 0.08 nm.

In FIG. 26A, reference numerals 3611–3616 designate terminals or centers.

Except as otherwise disclosed herein, the various components shown in outline or block form in the Figures are individually well known in the optical semiconductor device and optical communication arts, and their internal construction and operation are not critical either to the making or using of this invention or to a description of the best mode of the invention.

While the present invention has been described with respect to what are presently considered to be the preferred embodiments, it is to be understood that the invention is not limited to the disclosed embodiments. The present invention is intended to cover various modifications and equivalent arrangements included within the sprit and scope of the following claims.

What is claimed is:

1. An optical semiconductor apparatus capable of selecting a polarization of output light comprising:

at least two semiconductor laser portions, each of said semiconductor laser portions comprising a light waveguide with an active layer and a distributed reflector, said semiconductor laser portions being serially arranged in a light propagation direction, and said light waveguides being constructed such that a difference between propagation constants for two different polarization modes in one of said waveguides is different from a difference between propagation constants for the two different polarization modes in the other of said waveguides; and stimulating means for independently stimulating said active layers.

2. An optical semiconductor apparatus according to claim 1, wherein a light confinement width of one of said light waveguides in a lateral direction perpendicular to the light propagation direction is different from a light confinement width of the other of said light waveguides in the lateral direction.

3. An optical semiconductor apparatus according to claim 1, wherein said waveguides are constructed such that transverse modes of laser oscillation in said waveguides are respectively 0(zero)-th orders.

4. An optical semiconductor apparatus according to claim 1, wherein a layer structure of one of said light waveguides in a layering direction is different from a layer structure of the other of said light waveguides in the layering direction.

5. An optical semiconductor apparatus according to claim 4, wherein at least one of a layer thickness and composition of said active layer in one of said light waveguides is different from at least one of a layer thickness and composition of said active layer in the other of said light waveguides.

6. An optical semiconductor apparatus according to claim 1, wherein said distributed reflector includes a phase shift section.

7. An optical semiconductor apparatus according to claim 1, wherein a pitch of said distributed reflector in one of said light waveguides is different from a pitch of said distributed reflector in the other of said light waveguides, such that a Bragg wavelength for one of the different polarization modes in one of said light waveguides coincides with a Bragg wavelength for the one of the different polarization modes in the other of said light waveguides under a condition under which said active layers are uniformly stimulated by said stimulating means.

8. An optical semiconductor apparatus according to claim 1, wherein at least part of said active layers comprises a quantum well structure.

9. An optical semiconductor apparatus according to claim 1, wherein at least part of a layer of said light waveguides other than said active layers comprises a quantum well structure.

10. An optical semiconductor apparatus according to claim 1, wherein one of said light waveguides includes a mixed portion of a quantum well structure and the other of said light waveguides includes a non-mixed portion of a quantum well structure.

11. An optical semiconductor apparatus according to claim 1, wherein said light waveguides are constructed such that a difference amount between a difference between Bragg wavelengths for the two different polarization modes in one of said light waveguides and a difference between Bragg wavelengths for the two different polarizaton modes in the other of said light waveguides is larger than a stop band width for one of the two different polarization modes in one of said light waveguides.

12. An optical semiconductor apparatus according to claim 1, wherein said active layer in at least one of said light waveguides comprises a tensile-strained quantum well structure.

13. An optical semiconductor apparatus according to claim 1, wherein the different polarization modes are a transverse electric (TE) mode and a transverse magnetic (TM) mode and a Bragg wavelength in at least one of said light waveguides is set close to a gain peak wavelength of the TM mode which is shorter than a gain peak wavelength of the TE mode.

14. An optical semiconductor apparatus according to claim 1, further comprising:
a refractive index regulating layer formed parallel to said active layers; and
control means for controlling said apparatus to perform one of injecting current into, and applying a voltage to, said refractive index regulating layer independently from the stimulation of said active layer.

15. An optical semiconductor apparatus according to claim 14, wherein a pitch of said distributed reflector in one of said light waveguides is different from a pitch of said distributed reflector in the other of said light waveguides.

16. An optical semiconductor apparatus according to claim 14, wherein at least one of a layer thickness, width, and composition of said refractive index regulating layer in one of said light waveguides is different from at least one of a layer thickness, width, and composition of said refractive index regulating layer in the other of said light waveguides.

17. An optical semiconductor apparatus according to claim 14, wherein a structure of said refractive index regulating layer in one of said light waveguides is the same as a structure of said refractive index regulating layer in the other of said light waveguides.

18. An optical semiconductor apparatus according to claim 14, wherein a light confinement width of one of said light waveguides in a lateral direction perpendicular to the propagation direction is different from a light confinement width of the other of said light waveguides in the lateral direction.

19. An optical semiconductor apparatus according to claim 14, wherein a plurality of said control means are respectively arranged for said refractive index regulating layer in one of said light waveguides and said refractive index regulating layer in the other of said light waveguides.

20. An optical semiconductor apparatus according to claim 14, wherein said refractive index regulating layer comprises a quantum well structure.

21. An optical semiconductor apparatus according to claim 14, wherein one of said refractive index regulating layers comprises a quantum well structure and the other of said refractive index regulating layers comprises a mixed quantum well structure.

22. An optical semiconductor apparatus according to claim 1, wherein said active layer comprises a bulk structure.

23. An optical semiconductor apparatus according to claim 1, wherein said two different polarization modes are a transverse electric (TE) mode and a transverse magnetic (TM) mode, and a pitch of said distributed reflector is set such that a Bragg wavelength for the TM mode is close to a wavelength which corresponds to an energy bandgap between a ground level of light holes and a ground level of electrons.

24. An optical semiconductor apparatus according to claim 1, further comprising a phase shift portion with a light waveguide interposed between said two semiconductor laser portions, and wherein an equivalent refractive index of said light waveguide of said phase shift portion is the largest of equivalent refractive indices of said three light waveguides.

25. An optical semiconductor apparatus according to claim 1, further comprising a phase shift portion with a light waveguide interposed between said two semiconductor laser portions, and wherein an equivalent refractive index of said light waveguide of said phase shift portion is the smallest of equivalent refractive indices of said three light waveguides.

26. An optical semiconductor apparatus according to claim 24 or 25, wherein a layer thickness of said light waveguide in said phase shift portion is the largest of layer thicknesses of said three light waveguides.

27. An optical semiconductor apparatus according to claim 24 or 25, wherein a layer thickness of said light waveguide in said phase shift portion is the smallest of layer thicknesses of said three light waveguides.

28. An optical semiconductor apparatus according to claim 24 or 25, wherein layer thicknesses of light guide layers of said three light waveguides are different from each other.

29. An optical semiconductor apparatus according to claim 24 or 25, wherein layer thicknesses of at least said active layers of said three light waveguides are different from each other.

30. An optical semiconductor apparatus according to claim 24 or 25, wherein widths of said three light waveguides are different from each other and the width of said light waveguide in said phase shift portion is the largest.

31. An optical semiconductor apparatus according to claim 24 or 25, wherein widths of said three light waveguides are different from each other and the width of said light waveguide in said phase shift portion is the smallest.

32. An optical semiconductor apparatus according to claim 30, wherein shapes of portions between said light waveguide in said phase shift portion and said light waveguides in said semiconductor laser portions are tapered.

33. An optical semiconductor apparatus according to claim 1, wherein said optical semiconductor apparatus is constructed as a semiconductor laser apparatus.

34. An optical semiconductor apparatus according to claim 1, wherein said stimulating means comprises current injection means for independently injecting currents into said active layers of said light waveguides.

35. An optical semiconductor apparatus capable of selecting a polarization of output light comprising:

at least two semiconductor laser portions, each of said semiconductor laser portions comprising a light waveguide with an active layer and a distributed reflector, said semiconductor laser portions being serially arranged in a light propagation direction, said light waveguides being constructed such that a difference between Bragg wavelengths for two different polarization modes in one of said waveguides is different from a difference between Bragg wavelengths for the two different polarization modes in the other of said waveguides; and stimulating means for independently stimulating said active layers of said light waveguides.

36. An optical semiconductor apparatus capable of selecting a polarization of output light comprising:

at least two semiconductor laser portions, each of said semiconductor laser portions comprising a light waveguide with an active layer and a distributed reflector, said semiconductor laser portions being serially arranged in a light propagation direction, said light waveguides being constructed such that a difference between equivalent refractive indices for two different polarization modes in one of said waveguides is different from a difference between equivalent refractive indices for the two different polarization modes in the other of said waveguides; and stimulating means for independently stimulating said active layers of said light waveguides.

37. A light source apparatus comprising:

an optical semiconductor apparatus, a polarization mode of light output from said optical semiconductor apparatus being modulated between two mutually-perpendicular polarization modes by controlling one of current injection into and voltage application to said optical semiconductor apparatus, and said optical semiconductor apparatus including at least two semiconductor laser portions, each of said semiconductor laser portions comprising a light waveguide with an active layer and a distributed reflector, said semiconductor laser portions being serially arranged in a light propagation direction, said light waveguides being constructed such that a difference between propagation constants for two different polarization modes in one of said light waveguides is different from a difference between propagation constants for the two different polarization modes in the other of said light waveguides, and stimulating means for independently stimulating said active layers of said light waveguides; and means for selecting only the light output in one of the two mutually-perpendicular modes.

38. An optical communication method for transmitting a signal from a transmitter to a receiver through an optical transmission line, said method comprising the steps of:

modulating the polarization mode of light output from an optical semiconductor apparatus between two mutually-perpendicular polarization modes by controlling current injected into the optical semiconductor apparatus, the optical semiconductor apparatus including at least two semiconductor laser portions, each of the semiconductor laser portions having a light waveguide with an active layer and a distributed reflector, the semiconductor laser portions being serially arranged in a light propagation direction, the light waveguides being constructed such that a difference between propagation constants for two different polarization modes in one of the light waveguides is different from a difference between propagation constants for the two different polarization modes in the other of the light waveguides, and stimulating means for independently stimulating the active layers of the light waveguides;

selecting only the light output in one of the two mutually-perpendicular polarization modes to create an amplitude-modulated signal; and transmitting the amplitude-modulated signal through the optical transmission line.

39. An optical communication method according to claim 38, wherein the wavelength of the amplitude-modulated signal is tuned by controlling one of injection of current into and application of a voltage to the optical semiconductor apparatus, and a signal at a desired wavelength is selectively detected by using a wavelength filter in the receiver.

40. An optical communication system for transmitting a signal from a transmitter to a receiver through an optical transmission line, said system comprising:

an optical semiconductor apparatus provided in the transmitter, a polarization mode of light output from said optical semiconductor apparatus being modulated between two mutually-perpendicular polarization modes by controlling one of injection of current into and application of a voltage to said optical semiconductor apparatus, and said optical semiconductor apparatus including at least two semiconductor laser portions each having a light waveguide with an active layer and a distributed reflector, said semiconductor laser portions being serially arranged in a light propagation direction, said light waveguides being constructed such that a difference between propagation constants for two different polarization modes in one of said light waveguides is different from a difference between propagation constants for the two different polarization modes in the other of said waveguides, and stimulating means for independently stimulating said active layers of said light waveguides; and means for selecting only the light output in one of the two mutually-perpendicular modes so as to create an amplitude-modulated signal, the amplitude-modulated signal being the signal transmitted from the transmitter to the receiver through the optical transmission line.

41. An optical communication system according to claim 40, wherein said optical semiconductor apparatus changes the wavelength of the amplitude-modulated signal, said system further comprising a wavelength filter provided in the receiver for selectively detecting the signal at a desired wavelength.

42. A driving method for driving an optical semiconductor apparatus to switch an oscillation mode between two mutually-perpendicular oscillation polarization modes, said method comprising the steps of:

preparing an optical semiconductor apparatus including at least two semiconductor laser portions each of said semiconductor laser portions having a light waveguide with an active layer and a distributed reflector, the semiconductor laser portions being serially arranged in a light propagation direction, the light waveguides being constructed such that a difference between propagation constants for two different polarization modes in one of the light waveguides is different from a difference between propagation constants for the two different polarization modes in the other of the light waveguides, and current injection means for independently injecting currents into the active layers of the light waveguides; and injecting a modulation current signal into at least one of the active layers of the light waveguides by the current injection means to switch an oscillation state between a state in which Bragg wavelengths for one of the two different polarization modes coincide with each other between said light waveguides and a state in which Bragg wavelengths for the other of the two different polarization modes coincide with each other between the light waveguides.

43. A driving method for driving an optical semiconductor apparatus to switch an oscillation mode between two mutually-perpendicular oscillation polarization modes, said method comprising the steps of:

preparing the optical semiconductor apparatus to include at least two semiconductor laser portions each of said semiconductor laser portions having a light waveguide with an active layer and a distributed reflector, a refractive index regulating layer formed parallel to the active layer, and control means for injecting current into or applying a voltage to the refractive index regulating layer, the semiconductor laser portions being serially arranged in a light propagation direction, the light waveguides being constructed such that a difference between propagation constants for two different polarization modes in one of the light waveguides is different from a difference between propagation constants for the two different polarization modes in the other of the waveguides, and current injection means for independently injecting currents into the active layers of the light waveguides; and performing one of injection of a modulation current signal into and application of a modulation voltage signal to the refractive index regulating layer by the control means to switch an oscillation state between a state in which Bragg wavelengths for one of the two different polarization modes coincide with each other between the light waveguides and a state in which Bragg wavelengths for the other of the two different polarization modes coincide with each other between the light waveguides.

44. A driving method for driving an optical semiconductor apparatus to switch an oscillation mode between two mutually-perpendicular oscillation polarization modes, said method comprising the steps of:

preparing the optical semiconductor apparatus to include at least two semiconductor laser portions each having a light waveguide with an active layer and a distributed reflector, the semiconductor laser portions being serially arranged in a light propagation direction, the light waveguides being constructed such that a difference between propagation constants for two different polarization modes in one of the light waveguides is different from a difference between propagation constants for the two different polarization modes in the other of the light waveguides, a phase shift portion with a waveguide interposed between the two semiconductor laser portions, an equivalent refractive index of the light waveguide of said phase shift portion being the largest of equivalent refractive indices of the three light waveguides, and current injection means for independently injecting currents into the three light waveguides; and injecting a modulation current signal into at least one of the three light waveguides by the current injection means to switch an oscillation state between a state in which Bragg wavelengths for one of the two different polarization modes coincide with each other between the light waveguides and a resonance phase condition is satisfied and a state in which Bragg wavelengths for the other of the two different polarization modes coincide with each other between the light waveguides and a resonance phase condition is satisfied.

45. A driving method for driving an optical semiconductor apparatus to switch an oscillation mode between two mutually-perpendicular oscillation polarization modes, said method comprising the steps of:

preparing the optical semiconductor apparatus to include at least two semiconductor laser portions each having a light waveguide with an active layer and a distributed reflector, the semiconductor laser portions being serially arranged in a light propagation direction, the light waveguides being constructed such that a difference between propagation constants for two different polarization modes in one of the light waveguides is different from a difference between propagation constants for the two different polarization modes in the other of the light waveguides, a phase shift portion with a waveguide interposed between the two semiconductor laser portions, an equivalent refractive index of the light waveguide of said phase shift portion being the smallest of equivalent refractive indices of the three light waveguides, and current injection means for independently injecting currents into the three light waveguides; and injecting a modulation current signal into at least one of the three light waveguides by the current injection means to switch an oscillation state between a state in which Bragg wavelengths for one of the two different polarization modes coincide with each other between the light waveguides and a resonance phase condition is satisfied and a state in which Bragg wavelengths for the other of the two different polarization modes coincide with each other between the light waveguides and a resonance phase condition is satisfied.

46. An optical semiconductor apparatus capable of selecting a polarization of output light comprising:

at least two semiconductor laser portions, each of said semiconductor laser portions comprising a light waveguide with an active layer and a distributed reflector, said semiconductor laser portions being serially arranged in a light propagation direction, and said light waveguides being constructed such that a difference between propagation constants for two different polarization modes in one of said waveguides is different from a difference between propagation constants for the two different polarization modes in the other of said waveguides; and electrodes for independently injecting current to said active layers of said at least two semiconductor laser portions.

47. An optical semiconductor apparatus capable of selecting a polarization of output light comprising:

at least two semiconductor laser portions, each of said semiconductor laser portions comprising a light waveguide with an active layer and a distributed reflector, said semiconductor laser portions being serially arranged in a light propagation direction, said light waveguides being constructed such that a difference between Bragg wavelengths for two different polarization modes in one of said waveguides is different from a difference between Bragg wavelengths for the two different polarization modes in the other of said waveguides; and electrodes for independently injecting current to said active layers of said at least two semiconductor laser portions.

48. An optical semiconductor apparatus capable of selecting a polarization of output light comprising:

at least two semiconductor laser portions, each of said semiconductor laser portions comprising a light waveguide with an active layer and a distributed reflector, said semiconductor laser portions being serially arranged in a light propagation direction, said light waveguides being constructed such that a difference between equivalent refractive indices for two different polarization modes in one of said waveguides is different from a difference between equivalent refractive indices for the two different polarization modes in the other of said light waveguides; and electrodes for independently injecting current to said active layers of said at least two semiconductor laser portions.

49. A driving method for driving an optical semiconductor apparatus comprising at least two semiconductor laser portions, each of said semiconductor laser portions comprising a light waveguide with an active layer and a distributed reflector, said semiconductor laser portions being serially arranged in a light propagation direction, said light waveguides being constructed such that a difference between Bragg wavelengths for two different polarization modes in one of said waveguides is different from a difference between Bragg wavelengths for the two different polarization modes in the other of said waveguides, said method comprising steps of:

injecting current to the active layers of the at least two semiconductor laser portions independently; and switching an oscillation state between a state in which Bragg wavelengths for one of the two different polarization modes coincide with each other between the light waveguides and a state in which Bragg wavelengths for the other of the two different polarization modes coincide with each other between the light waveguides.

* * * * *

UNITED STATES PATENT AND TRADEMARK OFFICE
CERTIFICATE OF CORRECTION

PATENT NO. : 5,878,066
DATED : March 2, 1999
INVENTOR(S): NATSUHIKO MIZUTANI, ET AL.

It is certified that error appears in the above-identified patent and that said Letters Patent is hereby corrected as shown below:

COVER PAGE AT ITEM [54] TITLE,
"OPTICAL SEMICONDUCTOR APPARATUS DRIVING METHOD THEREFOR LIGHT SOURCE APPARATUS AND OPTICAL COMMUNICATION SYSTEM USING THE SAME" should read --OPTICAL SEMICONDUCTOR APPARATUS, DRIVING METHOD THEREFOR, LIGHT SOURCE APPARATUS AND OPTICAL COMMUNICATION SYSTEM USING THE SAME--.

COVER PAGE AT ITEM [56] FOREIGN PATENT DOCUMENTS,
"2117190" should read --2-117190--.

COVER PAGE AT ITEM [56] OTHER PUBLICATIONS,
In T. Matsuyama, "612" should read --=pp. 612--.

COLUMN 1,
Line 1, "APPARATUS" should read --APPARATUS,--; and
Line 2, "THEREFOR" should read --THEREFOR,--.

COLUMN 4,
Line 20, "semiconductor apparatus" should be deleted.

COLUMN 10,
Line 35, "than than" should read --than--.

UNITED STATES PATENT AND TRADEMARK OFFICE
CERTIFICATE OF CORRECTION

PATENT NO. : 5,878,066

DATED : March 2, 1999

INVENTOR(S) : NATSUHIKO MIZUTANI, ET AL.

It is certified that error appears in the above-identified patent and that said Letters Patent is hereby corrected as shown below:

<u>COLUMN 12</u>,
Line 33, "IDFB" should read --DFB--.

<u>COLUMN 16</u>,
Line 21, "$\lambda_2^{TE}$ and $\lambda_2^{TM}$." should read --$\lambda_2^{TE}$ and $\lambda_2^{TM}$.--.

<u>COLUMN 18</u>,
Line 63, torelance" should read --tolerance--.

<u>COLUMN 21</u>,
Line 46, "$n_{eq1}$" should read --$n_{eqi}$--; and
Line 49, "$\lambda_b = 2n_{eq1}\Lambda$." should read --$\lambda_b = 2n_{eqi}\Lambda$.--.

<u>COLUMN 22</u>,
Line 31, "0.1 $\lambda$m," should read --0.1$\mu$m,--.

Signed and Sealed this

Twenty-second Day of May, 2001

Attest:

NICHOLAS P. GODICI

*Attesting Officer*    Acting Director of the United States Patent and Trademark Office